(12) United States Patent
Yoshida et al.

(10) Patent No.: US 10,845,658 B2
(45) Date of Patent: Nov. 24, 2020

(54) DISPLAY DEVICE HAVING A PLURALITY OF PERIPHERAL WIRINGS

(71) Applicant: SHARP KABUSHIKI KAISHA, Sakai (JP)

(72) Inventors: Masahiro Yoshida, Sakai (JP); Masakatsu Tominaga, Sakai (JP)

(73) Assignee: SHARP KABUSHIKI KAISHA, Sakai (JP)

(*) Notice: Subject to any disclaimer, the term of this patent is extended or adjusted under 35 U.S.C. 154(b) by 0 days.

(21) Appl. No.: 16/206,920

(22) Filed: Nov. 30, 2018

(65) Prior Publication Data

US 2019/0171075 A1    Jun. 6, 2019

(30) Foreign Application Priority Data

Dec. 1, 2017    (JP) .................... 2017-231596

(51) Int. Cl.
   *G02F 1/1362*    (2006.01)
   *G02F 1/1345*    (2006.01)
   *H05K 1/14*    (2006.01)
   *G02F 1/1368*    (2006.01)

(52) U.S. Cl.
   CPC ...... *G02F 1/136259* (2013.01); *G02F 1/1345* (2013.01); *G02F 1/13452* (2013.01); *G02F 1/136286* (2013.01); *H05K 1/147* (2013.01); *G02F 1/1368* (2013.01); *G02F 2001/136263* (2013.01); *G02F 2001/136272* (2013.01)

(58) Field of Classification Search
   CPC combination set(s) only.
   See application file for complete search history.

(56) References Cited

U.S. PATENT DOCUMENTS 9,679,925 B2    6/2017    Itoh
2005/0195338 A1*    9/2005    Matsumoto ....... G02F 1/136204
                                                     349/40
2015/0357355 A1*    12/2015    Itoh ................... G02F 1/136259
                                                     257/43

FOREIGN PATENT DOCUMENTS

WO        2014-109221 A1    7/2014

\* cited by examiner

*Primary Examiner* — Lauren Nguyen
(74) *Attorney, Agent, or Firm* — ScienBiziP, P.C.

(57) ABSTRACT

A display device includes: display wires; first wires including first end portions overlapped with first end portions of the plurality of display wires via an insulating film; second wires including first end portions overlapped with second end portions of the display wires via the insulating film; third wires routed from second end portions of the first wires to second end portions of the second wires; a fourth wire overlapping with the second end portions of the first wires and first end portions of the third wires via the insulating film; and a fifth wire overlapping with the second end portions of the second wires and second end portions of the third wire via the insulating film.

6 Claims, 22 Drawing Sheets

DISPLAY DEVICE HAVING A PLURALITY OF PERIPHERAL WIRINGS

CROSS REFERENCE TO RELATED APPLICATION

This application claims priority from Japanese Patent Application No. 2017-231596 filed on Dec. 1, 2017. The entire contents of the priority application are incorporated herein by reference.

TECHNICAL FIELD

The technology described herein relates to a display device.

BACKGROUND

As an exemplary conventional liquid crystal display device, a liquid crystal display device disclosed in WO 2014/109221 is known. The liquid crystal display device disclosed in WO 2014/109221 includes an active matrix substrate provided with a first wire, a second wire, a third wire, a fourth wire, and a fifth wire provided at a non-display region. The first wire crosses the non-input side end of at least part of bus lines in a first bus line group via an insulating layer. The second wire crosses the non-input side end of at least part of bus lines in a second bus line group via the insulating layer. The third wire crosses the input side end of the first bus line group via the insulating layer, while not crossing the second bus line group. The fourth wire crosses the input side end of the second bus line group via the insulating layer, while not crossing the first bus line group. The fifth wire is routed to cross the first, second, third, and fourth wires via the insulating layer. The third wire and the fourth wire are electrically separated from each other.

In the liquid crystal display device disclosed in WO 2014/109221, the fifth wire is also arranged in a second FPC where a gate driver is mounted. Since the second FPC requires, in addition to a region for mounting the gate driver, a region for forming a gate lead line connected to the gate driver and a gate bus line, a region for forming the fifth wire is limited. Accordingly, it is difficult to fully secure a wide width for the fifth wire, which tends to raise the trace resistance. The raised trace resistance may invite edge-rounding of a signal.

SUMMARY

The technology described herein was made in view of the above circumstances. An object is to minimize occurrence of an edge-rounded signal.

A display device of the technology described herein includes: display wires; first wires including first end portions overlapped with first end portions of the display wires via an insulating film; second wires including first end portions overlapped with second end portions of the display wires via the insulating film; third wires routed from second end portions of the first wires to second end portions of the second wires; a fourth wire overlapping with the second end portions of the first wires and first end portions of the third wires via the insulating film; and a fifth wire overlapping with the second end portions of the second wires and second end portions of the third wire via the insulating film.

In this mode, when any of the display wires suffers a wire breakage or the like, a short circuit is established by a short-circuiting process such as laser irradiation between a first end portion and a second end portion of the display wire suffering the wire breakage out of the display wires and first end portions of the first wires and first end portions of the second wires respectively overlapping with the first end portion and the second end portion of the broken display wire via the insulating film. Further, a short circuit is established by a short-circuiting process between second end portions of the short-circuited first wires and the fourth wire overlapping with the short-circuited first wires via the insulating film. Further, a short circuit is established by a short-circuiting process between the short-circuited fourth wire and first end portions of the third wires overlapping with the short-circuited fourth wire via the insulating film. Then, a short circuit is established by a short-circuiting process between second end portions of the short-circuited second wires and the fifth wire overlapping with the short-circuited second wires via the insulating film. Further, a short circuit is established by a short-circuiting process between the short-circuited fifth wire and second end portions of the third wires overlapping with the short-circuited fifth wire via the insulating film. Thus, the display wire suffering a wire breakage or the like can be supplied with a signal via the first wires, the second wires, the third wires, the fourth wire, and the fifth wire.

Here, the repair of the display wire as described above may be performed on just part of the display wires. In this case, for example, by a short-circuiting process, the fourth wire and the fifth wire are short-circuited to third wires, which fourth wire and the fifth wire are respectively overlapping with second end portions of the first wires and second end portions of the second wires, which first wires and second wires respectively overlapping with first end portions and second end portions of the repair-target display wire suffering a wire breakage. Thus, by virtue of the repair-target display wire being supplied with a signal through the third wires, the trace resistance reduces and, hence, edge-rounding of a signal becomes less prone to occur. In particular, the technology described herein is useful for a higher-definition and larger-size device. Note that, the display wires not being the target of repair are avoided from erroneously supplied with a signal that is to be supplied to the repair-target display wire, by virtue of the first wires and the second wires respectively overlapping with first end portions and second end portions of the non-repair-target display wires being kept in the non-short-circuit state.

Further, when any of the third wires suffers a wire breakage or the like, the broken third wire can be repaired. That is, a short circuit is established by a short-circuiting process between a first end portion and a second end portion of the broken repair-target third wire and the fourth wire and the fifth wire respectively overlapping with the first end portion and the second end portion of the broken repair-target third wire. Further, a short circuit is established by a short-circuiting process respectively between the short-circuited fourth wire and the short-circuited fifth wire and first end portions and second end portions of other third wires overlapping with the short-circuited fourth wire and the short-circuited fifth wire. Thus, a signal can be transmitted, instead of the broken third wire, through the other third wires, the fourth wire, and the fifth wire.

The technology described herein minimizes occurrence of an edge-rounded signal.

DETAILED DESCRIPTION

First Embodiment

Figure 7:
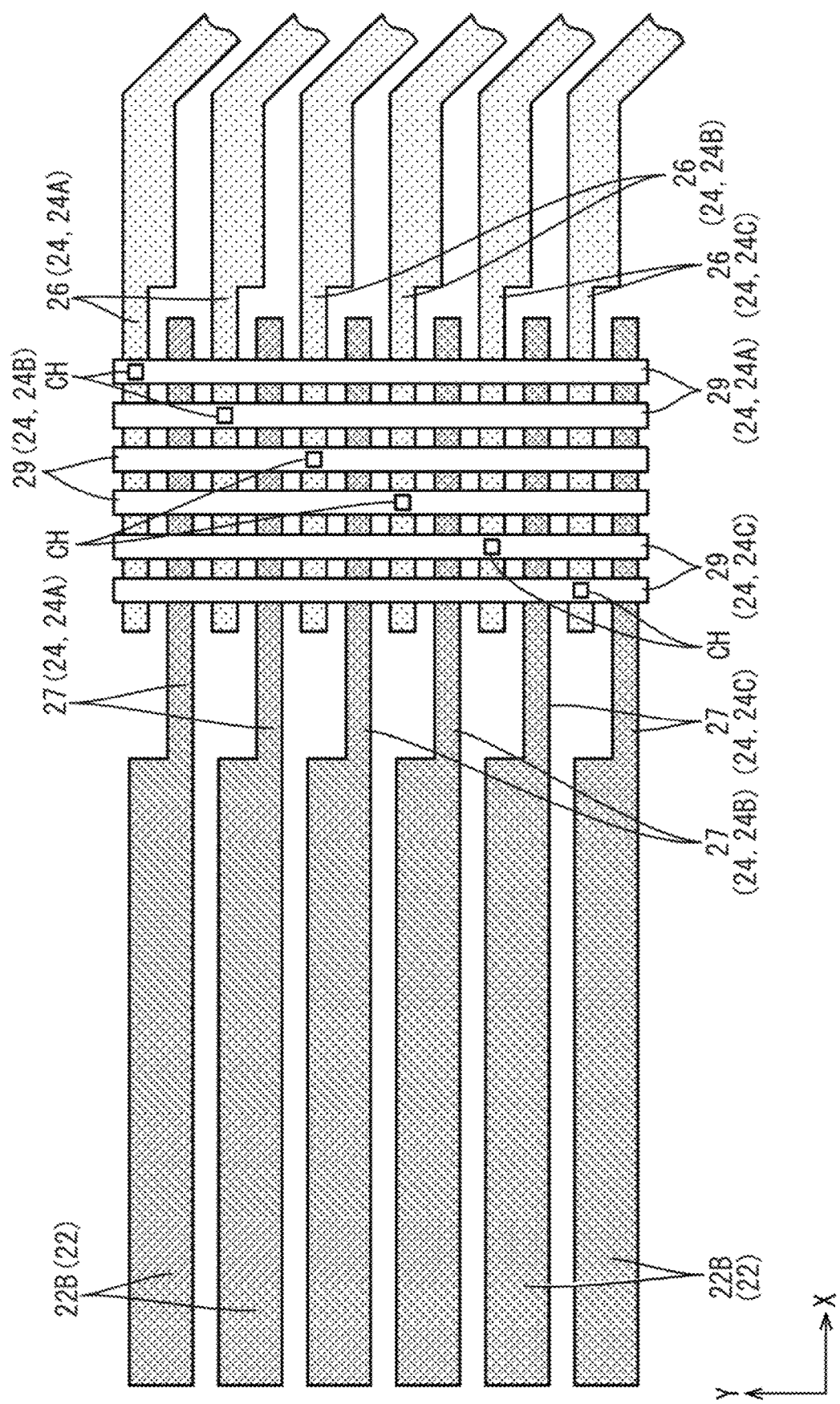
FIG. 7 is a plan view showing the relationship of second wire, the third wires, and the fifth wires being spare wires.
Figure 8:
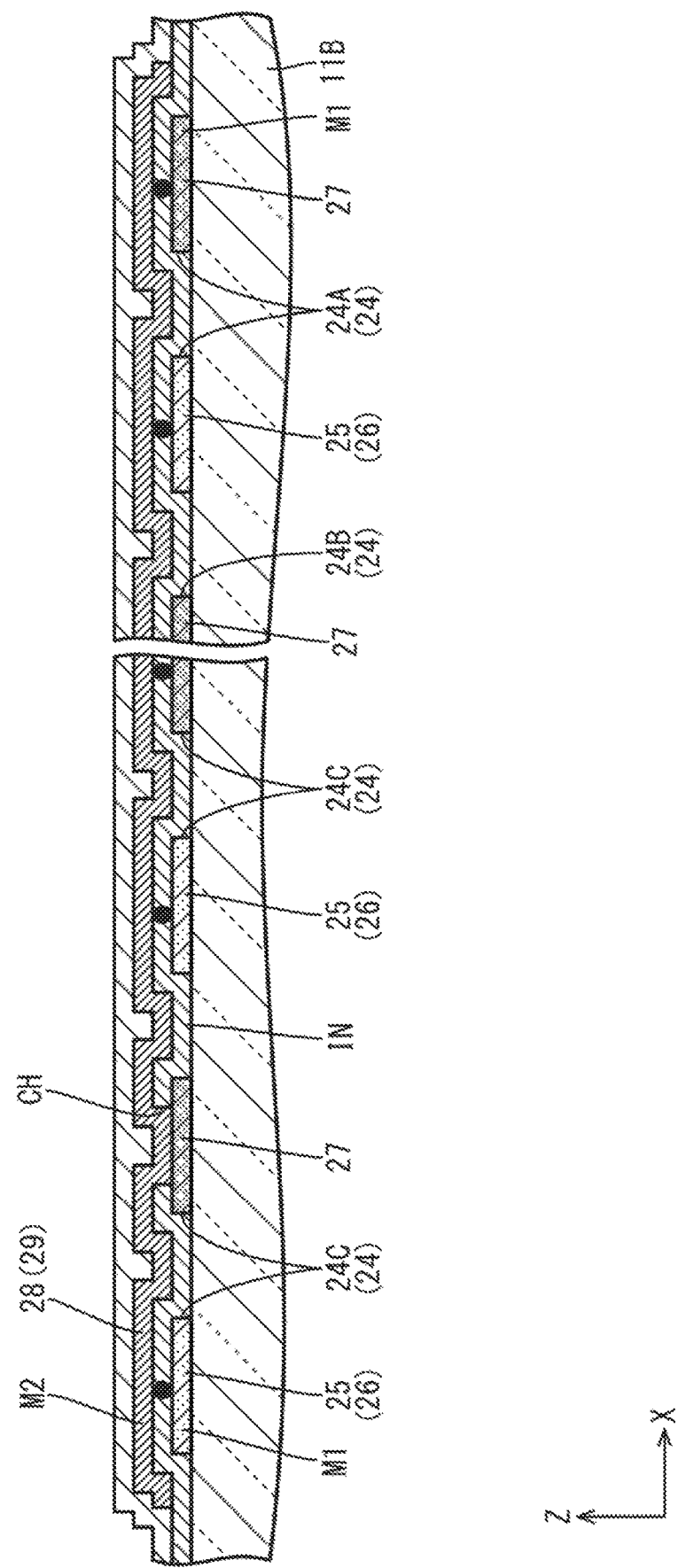
FIG. 8 is a cross-sectional view taken along the extending direction of the fourth wire (the fifth wire) being a spare wire.

With reference to FIGS. 1 to 13, a description will be given of a first embodiment of the technology described herein. The present embodiment exemplarily shows a liquid crystal display device 10. Note that, part of the drawings show X axis, Y axis, and Z axis, representing any direction specified by the drawings. Further, the upper side in FIG. 8 is the front side, while the lower side in FIG. 8 is the back side.

Figure 1:
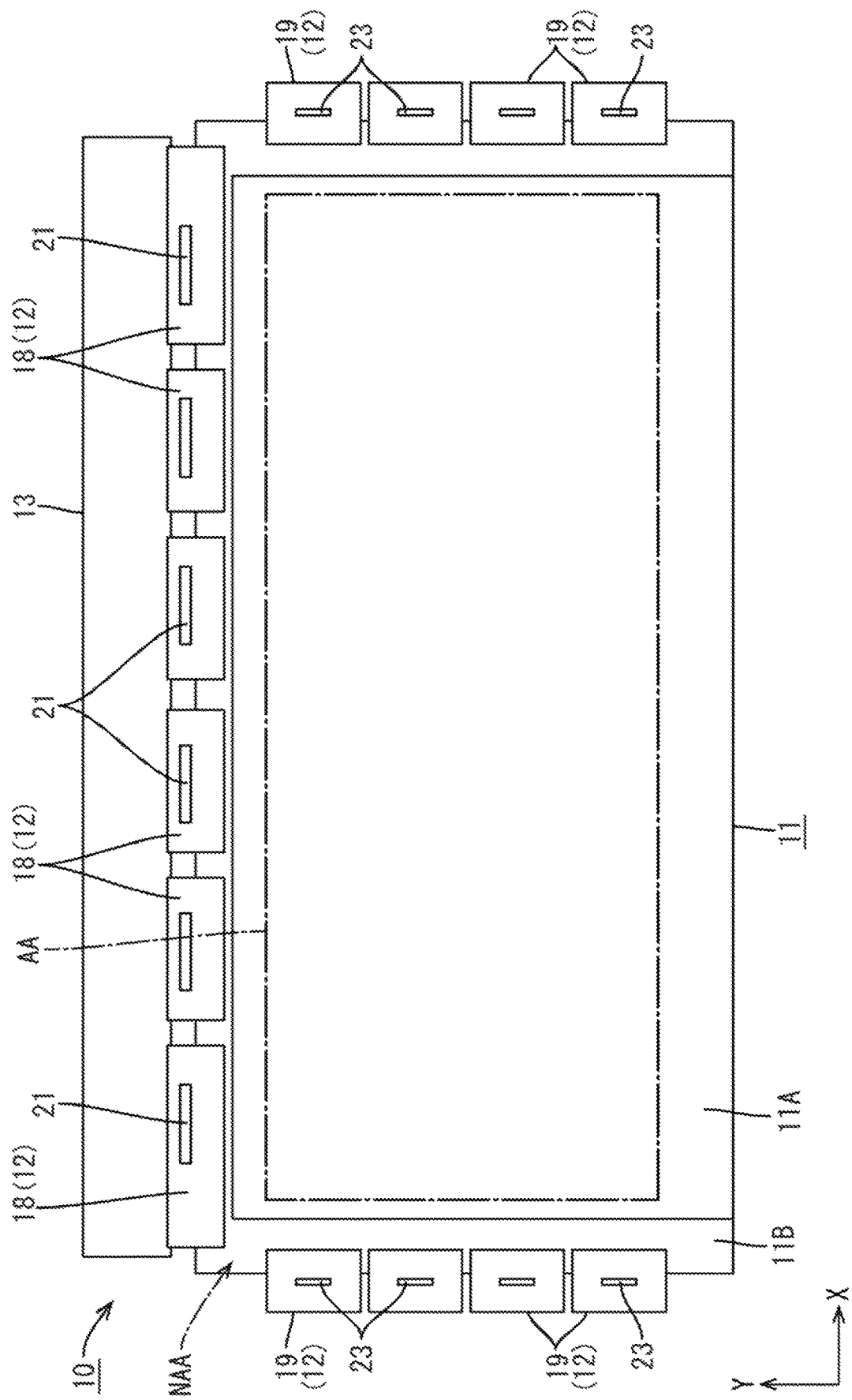
FIG. 1 is a plan view of a liquid crystal display device according to a first embodiment of the technology described herein.

The liquid crystal display device 10 according to the present embodiment at least includes, as shown in FIG. 1: a liquid crystal panel (display panel) 11 having a display surface where an image is displayed; a backlight device (not shown) disposed on the back side relative to the liquid crystal panel 11 to emit light used at the liquid crystal panel 11 for displaying an image; flexible printed circuit boards 12 connected to ends of the liquid crystal panel 11; and a printed circuit board 13 connected to part of the flexible printed circuit boards 12. The flexible printed circuit boards 12 and the printed circuit board 13 are directly or indirectly connected to the liquid crystal panel 11 thereby structuring one module component. Therefore, the flexible printed circuit boards 12 and the printed circuit board 13 can be regarded to structure a "liquid crystal panel module (a display panel module)" in conjunction with the liquid crystal panel 11. Note that, at each of the connection locations between the liquid crystal panel 11 and the flexible printed circuit boards 12, and the connection locations between the flexible printed circuit boards 12 and the printed circuit board 13, a not-shown ACF (Anisotropic Conductive Film) is interposed.

A description will be given of the liquid crystal panel 11. As shown in FIG. 1, the liquid crystal panel 11 includes a pair of substrates 11A, 11B made of glass, being substantially transparent and exhibiting excellent light transmissivity. Between the substrates 11A, 11B, a liquid crystal layer in which the orientation state of the liquid crystal changes upon application of an electric field, and a seal part sealing around the liquid crystal layer are interposed (both the liquid crystal layer and the seal part being not shown). In the liquid crystal panel 11, the display surface is sectioned into a display region (active area) AA formed by the central portion where an image is displayed, and a non-display region (non-active area) NAA formed by the outer peripheral part to be rim-like (frame-like) surrounding the display region AA, where no image is displayed. Note that, in FIG. 1, the dot-and-dash line represents the outer shape of the display region AA. The region outer than the dot-and-dash line is the non-display region NAA. Note that, to the outer surface side of each of the substrates 11A, 11B, a polarizer (not shown) is bonded.

Figure 2:
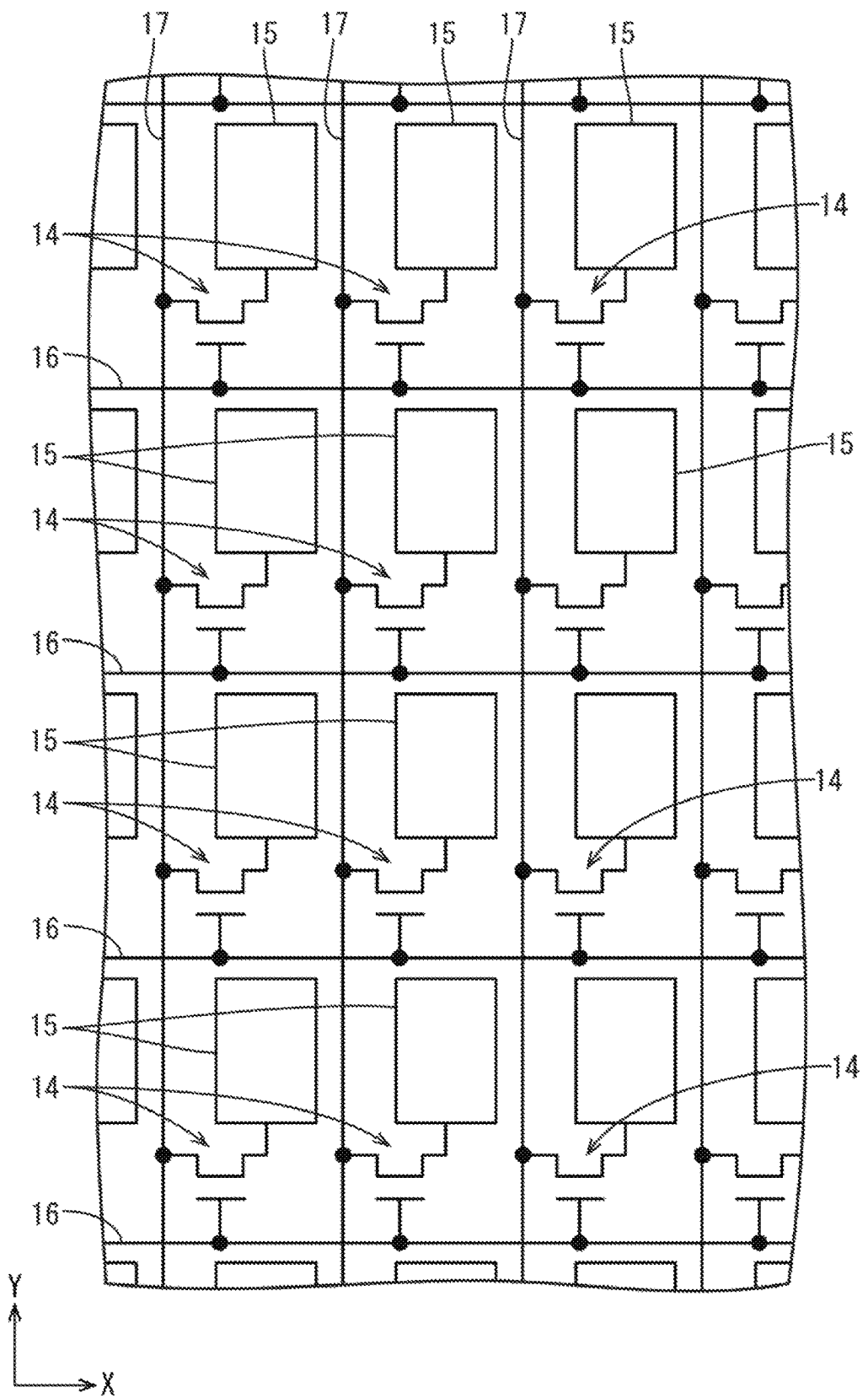
FIG. 2 is a plan view showing the wiring configuration in a display region of an array substrate structuring a liquid crystal panel of the liquid crystal display device.

In the substrates 11A, 11B structuring the liquid crystal panel 11, the front one (one on the front surface side) is a CF substrate 11A, and the back one (one on the back surface side) is an array substrate 11B. On the inner side of the display region AA of the array substrate 11B, as shown in FIG. 2, TFTs (Thin Film Transistors: display elements) 14 being switching elements and pixel electrodes 15 are arranged in a matrix (in rows and columns). Around the TFTs 14 and the pixel electrodes 15, grate-like gate lines (second display wires, scan lines) 16 and source lines (display wires, signal lines, data lines) 17 are arranged to surround the TFTs 14 and the pixel electrodes 15. The gate lines 16 extend substantially linearly in the X-axis direction (row direction) to transmit a scan signal, and the source lines 17 extend substantially linearly in the Y-axis direction (the column direction) to transmit an image signal. The gate lines 16 are each made of a first metal film M1 arranged relatively on the lower layer side, whereas the source lines 17 are each made of a second metal film M2 arranged relatively on the upper layer side, having an insulating film IN interposed between the first metal film M1 and the second metal film M2 (see FIG. 8). The interposed insulating film IN prevents a short-circuit between the gate lines 16 and the source lines 17 crossing each other. The gate lines 16 are connected to the gate electrode of the TFTs 14 and the source lines 17 are connected to the source electrode of the TFTs 14. The pixel electrodes 15 are connected to the drain electrode of the TFTs 14. The TFTs 14 are each driven by being supplied with a scan signal from the corresponding one of the gate lines 16. The TFT 14 supplies the image signal supplied from the source line 17 to the corresponding one of the pixel electrodes 15, thereby charging the pixel electrode 15 to attain a potential based on the image signal. Each of the pixel electrodes 15 is arranged in a quadrangular region defined by the gate lines 16 and the source lines 17, and made of a transparent electrode film composed of ITO (Indium Tin Oxide), IZO (Indium Zinc Oxide) or the like. On the other hand, on the inner surface side of the display region AA of the CF substrate 11A, while there are provided at least color filters arranged in a matrix so as to respectively oppose to the pixel electrodes 15 on the array substrate 11B side, and light blocking parts (black matrix) partitioning adjacent ones of the color films, they are not shown in the drawings.

Figure 3:
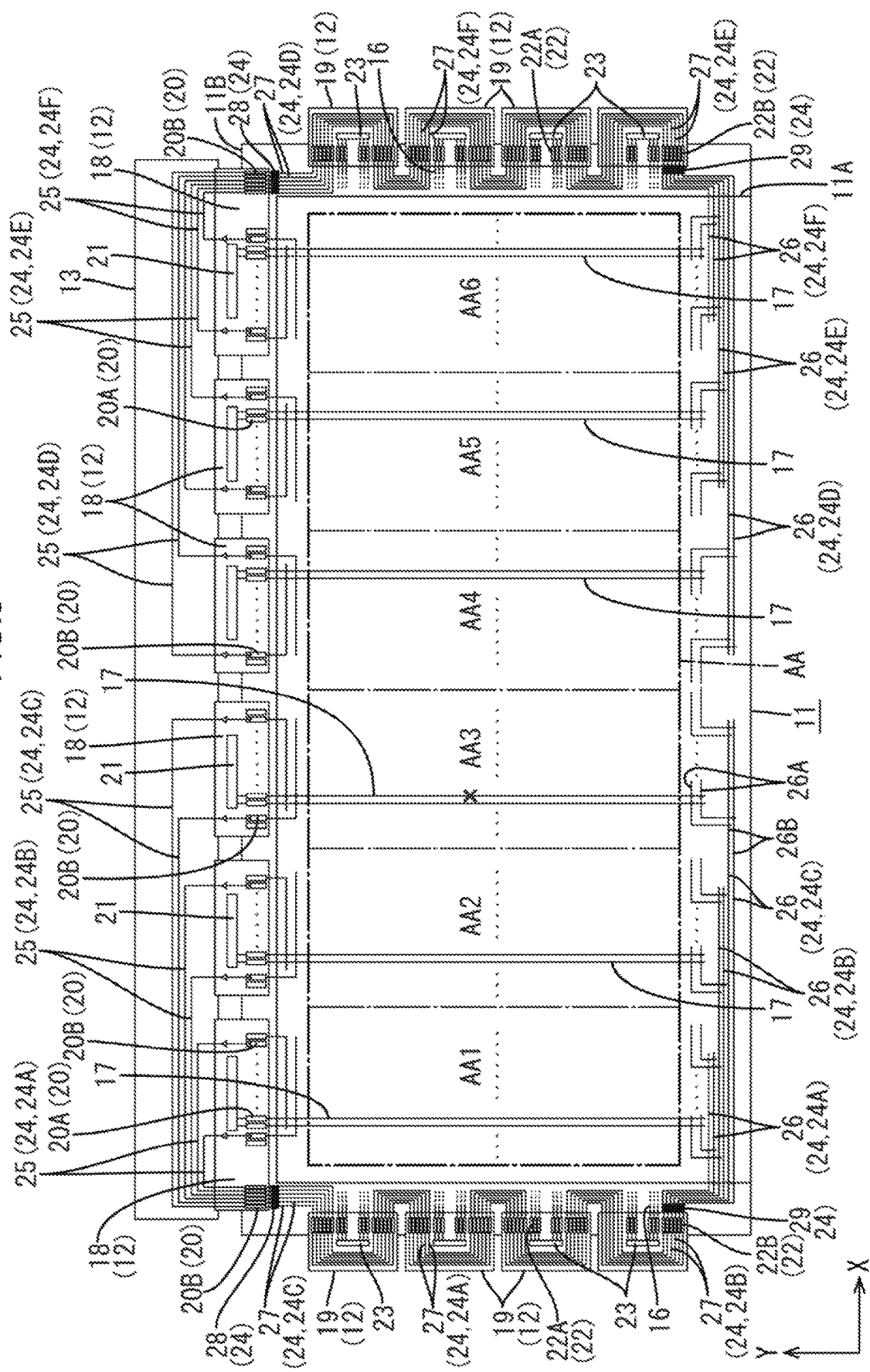
FIG. 3 is a plan view showing the wiring configuration of source lines and spare wires provided at the liquid crystal panel, flexible printed circuit boards, and a printed circuit board.

As shown in FIG. 3, the flexible printed circuit boards 12 are each made up of an insulating flexible film-like base member composed of a synthetic resin material (for example, polyimide-based resin), and a multitude of traces formed on the base member. The flexible printed circuit boards 12 include source-side flexible printed circuit boards (flexible printed circuit boards, first flexible printed circuit boards) 18 connected to the long-side end of the liquid crystal panel 11 in the non-display region NAA, and gate-side flexible printed circuit boards (second flexible printed circuit boards) 19 connected to each of the short-side ends of the liquid crystal panel 11 in the non-display region NAA. The plurality of (six in the present embodiment) source-side flexible printed circuit boards 18 are connected to one of the long-side ends (the upper one in FIG. 3) of the liquid crystal panel 11, as being arranged at a certain interval in the X-axis direction. The source-side flexible printed circuit boards 18 are connected to the first terminal parts 20 provided at the long-side end of the array substrate 11B. The plurality of first terminal parts 20 are arranged at a certain interval in the X-axis direction in the mount regions in the source-side flexible printed circuit boards 18. The plurality of first terminal parts 20 source line-dedicated first terminal parts (display wire-dedicated first terminal parts) 20A connected to one end side of the source lines 17 lead from the display region AA. A multitude of source lines 17 are connected to a specific source-side flexible printed circuit board 18 in accordance with the arrangement in the X-axis direction in the display region AA. That is, when the display region AA is divided, in sequence from the left side in X-axis direction in FIG. 3, into six, namely, a first section display region AA1, a second section display region AA2, a third section display region AA3, a fourth section display region AA4, a fifth section display region AA5, and a sixth section display region AA6, the six source-side flexible printed circuit boards 18 supply image signals to groups of source lines 17 arranged to the section display regions AA1 to AA6, respectively. Note that, in FIG. 3, the bold dot-and-dash line represents the outer shape of the display region AA, and the narrow dot-and-dash lines represent boundaries between the section display regions AA1 to AA6. At each of the source-side flexible printed circuit boards 18, a source driver (display driver) 21 supplying an image signal to the source lines 17 are mounted. It can be regarded that, while the first section display region AA1 and the sixth section display region AA6 are the "end-side section display regions" positioned on the opposite end sides in the X-axis direction in the display region AA, the third section display region AA3 and the fourth section display region AA4 are the "central section display regions" positioned on the central side in the X-axis direction in the display region AA. Note that, the source-side flexible printed circuit boards 18 are each provided with a terminal (not shown) connected to the corresponding first terminal part 20 on the array substrate 11B side via the ACF, and a terminal (not shown) connected to the corresponding terminal on the printed circuit board 13 side via the ACF. Note that, herein, each source line 17 includes not only the portion formed at the display region AA but also the portion formed at the non-display region NAA (for example, the portion connected to the source line-dedicated first terminal part (display wire-dedicated first terminal part) 20A (i.e., the source lead line)). The portion in each source line 17 being formed at the non-display region NAA may be formed by the second metal film M2 or the first metal film M1.

On the other hand, as shown in FIG. 3, the (four in the present embodiment) gate-side flexible printed circuit boards 19 are connected to each of opposite short-side ends of the liquid crystal panel 11, as being arranged at a certain interval in the Y-axis direction. The gate-side flexible printed circuit boards 19 are connected to second terminal parts 22 provided at the opposite short-side ends of the array substrate 11B. The second terminal parts 22 are arranged at a certain interval in the Y-axis direction in the mount region in the gate-side flexible printed circuit boards 19. The second terminal parts 22 include gate line-dedicated second terminal parts (second display wire-dedicated second terminal parts) 22A connected to first ends or second ends of corresponding gate lines 16 lead from the display region AA. A multitude of gate lines 16 are connected to a specific gate-side flexible printed circuit board 19 in accordance with the arrangement in the Y-axis direction in the display region AA. At each of the gate-side flexible printed circuit boards 19, a gate driver (second display driver) 23 supplying a scan signal to the gate lines 16 is mounted. Note that, the source drivers 21 and the gate drivers 23 are each an LSI chip including therein a driver circuit, and COF (Chip On Film)-mounted on the source-side flexible printed circuit boards 18 and the gate-side flexible printed circuit boards 19. Further, the gate-side flexible printed circuit boards 19 are each provided with a terminal (not shown) connected to the corresponding second terminal part 22 on the array substrate 11B side via the ACF. Note that, herein, each gate line 16 includes not only the portion formed at the display region AA but also the portion formed at the non-display region NAA (for example, the portion connected to the gate line-dedicated second terminal part (second display wire-dedicated second terminal part) 22A (i.e., the gate lead line). The portion in each gate line 16 being formed at the non-display region NAA may be formed by the first metal film M1 or the second metal film M2.

As shown in FIG. 3, the printed circuit board 13 is made up of an insulating rigid printed circuit board composed of a synthetic resin material, a multitude of traces formed on the rigid printed circuit board, and various kinds of electronic components. The printed circuit board 13 has a length substantially as great as the long side of the array substrate 11B. The end of the printed circuit board 13 is connected to the ends of the six source-side flexible printed circuit boards 18, which ends are on a side opposite to the ends on the array substrate 11B side. The printed circuit board 13 is provided with terminals (not shown) connected to the terminals of the source-side flexible printed circuit boards 18 via the ACFs, respectively. Note that, the flexible printed circuit boards 12 and the printed circuit board 13 may each be equipped with an amplifier circuit connected to spare wires 24, which will be described later.

Here, as shown in FIG. 3, the liquid crystal display device 10 according to the present embodiment includes the spare wires 24 for repairing any broken source lines 17. The spare wires 24 are arranged outer than the display region AA where the source lines 17 are arranged, and routed across the non-display region NAA in the array substrate 11B in the liquid crystal panel 11, the flexible printed circuit boards 12, and the printed circuit board 13. The spare wires 24 overlap with first end portions and second end portions of the source lines 17 via the insulating film IN. Accordingly, when any source line 17 suffers a wire breakage, the source line 17 can be short-circuited to a spare wire 24 by a short-circuiting process, in which the overlapping portion between the spare wire 24 and the source line 17 is irradiated with laser light or the like. Then, in the source line 17, the portion on a side opposite to the source driver 21 side with reference to the wire breakage is supplied with an image signal via the spare wire 24, and thus the broken source line 17 is repaired. The spare wires 24 are arranged by two in number for each of six section display regions AA1 to AA6 structuring the display region AA, that is, twelve in number in total are associated therewith. Accordingly, the source lines 17 can be repaired by two in number for each of the section display regions AA1 to AA6. Specifically, the spare wires 24 include two first spare wires 24A for repairing the source lines 17 in the first section display region AA1, two second spare wires 24B for repairing the source lines 17 in the second section display region AA2, two third spare wires 24C for repairing the source lines 17 in the third section display region AA3, two fourth spare wires 24D for repairing the source lines 17 in the fourth section display region AA4, two fifth spare wires 24E for repairing the source lines 17 in the fifth section display region AA5, and two sixth spare wires 24F for repairing the source lines 17 in the sixth section display region AA6. The first spare wires 24A, the second spare wires 24B, and the third spare wires 24C being two in number each are routed to pass through the left short side part in FIG. 3 in the liquid crystal panel 11, whereas the fourth spare wires 24D, the fifth spare wires 24E, and the sixth spare wires 24F being two in number each are routed to pass through the right short side part in FIG. 3 in the liquid crystal panel 11. In the first spare wires 24A to the third spare wires 24C routed in parallel to one another, the first spare wires 24A are arranged on the innermost side, and the third spare wires 24C are arranged on the outermost side. Similarly, in the fourth spare wires 24D to the sixth spare wires 24F routed in parallel to one another, the sixth spare wires 24F are arranged on the innermost side, and the fourth spare wires 24D are arranged on the outermost side. The creepage distance (the wire length) as to the spare wires 24A to 24F is shortest for the first spare wires 24A and the sixth spare wires 24F respectively associated with the section display regions AA1, AA6 positioned on the opposite ends, and longest for the third spare wires 24C and the fourth spare wires 24D respectively associated with the section display regions AA3, AA4 positioned on the central side.

As shown in FIG. 3, the spare wires 24 include: first wires 25 including first end portions overlapped with first end portions of the source lines 17; second wires 26 including first end portions overlapped with second end portions of the source lines 17; third wires 27 routed from second end portions of the first wires 25 to second end portions of the second wires 26; fourth wires 28 overlapping with the second end portions of the first wires 25 and first end portions of the third wires 27; and fifth wires 29 overlapping with the second end portions of the second wires 26 and second end portions of the third wires 27. That is, the spare wires 24 have a divided structure. The second end portions of the first wires 25, the second end portions of the second wires 26, and the third wires 27 structuring the spare wires 24 are each made of the first metal film M1 similarly to the gate lines 16 in the array substrate 11B, and the fourth wires 28 and the fifth wires 29 similarly structuring the spare wires 24 are each made of the second metal film M2 similarly to the source lines 17 (see FIG. 8). Accordingly, in the array substrate 11B, the insulating film IN is interposed at each of the overlapping portions between any of the first wires 25, the second wires 26, and the third wires 27, and any of the fourth wires 28 and the fifth wires 29.

Figure 4:
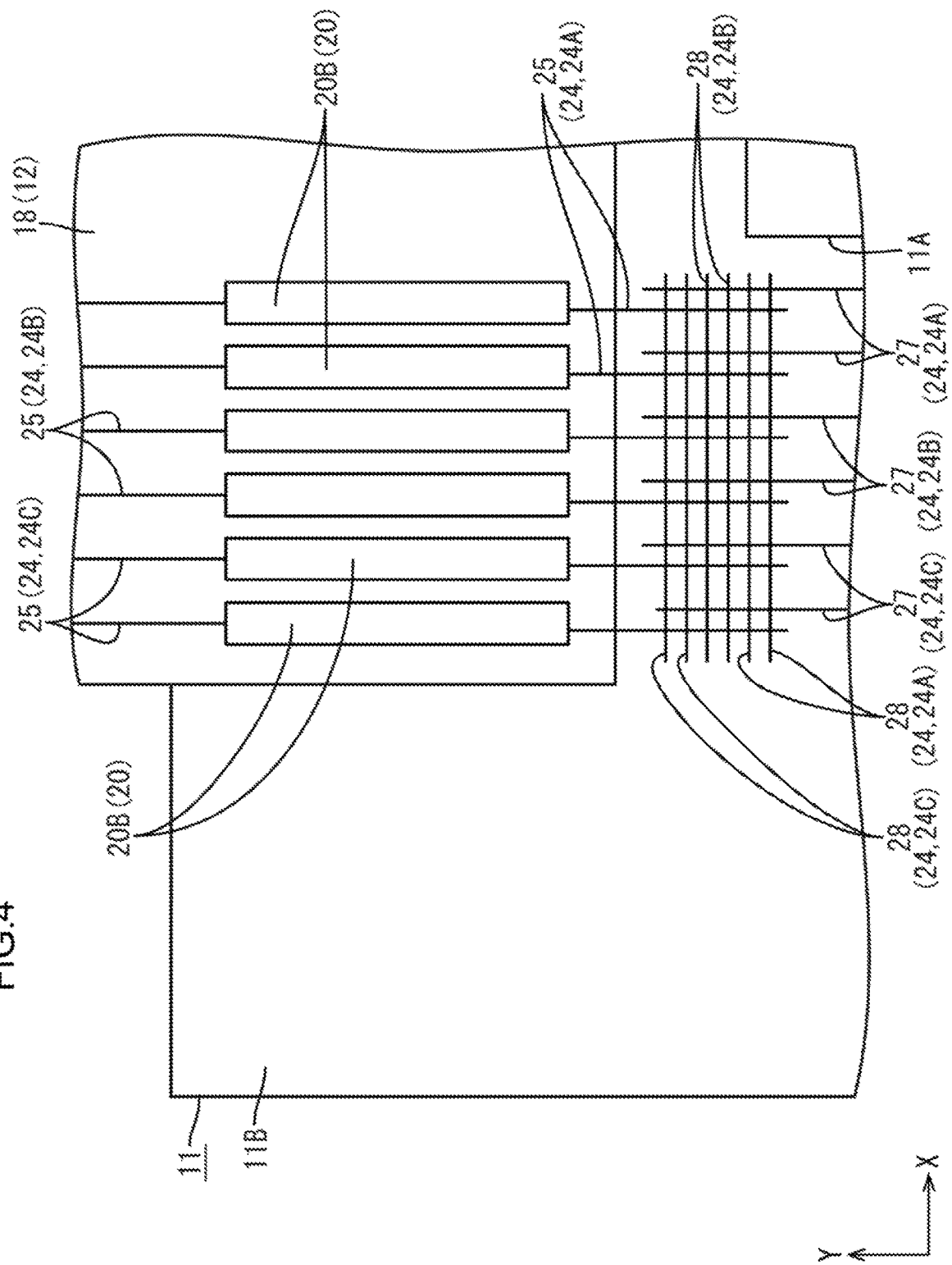
FIG. 4 is an enlarged plan view around a corner part in the liquid crystal panel where fourth wires being spare wires are arranged.

As shown in FIG. 3, the first wires 25 are routed across the array substrate 11B, the source-side flexible printed circuit boards 18, and the printed circuit board 13. Accordingly, the first terminal parts 20 of the array substrate 11B include, in addition to the source line-dedicated first terminal parts 20A, spare wire-dedicated first terminal parts 20B connected to the first wires 25. The first wires 25 extend in the X-axis direction to cross first end portions of the source lines 17 via the insulating film IN in the non-display region NAA of the array substrate 11B and then bent and connected to the spare wire-dedicated first terminal parts 20B. From the spare wire-dedicated first terminal parts 20B, the first wires 25 are routed to reach the printed circuit board 13 via the source-side flexible printed circuit boards 18 respectively mounted for the section display regions AA1 to AA6. In the printed circuit board 13, the first wires 25 are routed to extend toward the ends in the X-axis direction, to reach the source-side flexible printed circuit boards 18 positioned at the ends in the X-axis direction. Then, as shown in FIG. 4, the first wires 25 are connected to the spare wire-dedicated first terminal parts 20B arranged around the end (the corner) in the X-axis direction in the array substrate 11B, and then extend in the Y-axis direction in the direction opposite to the source-side flexible printed circuit boards 18, including ends arranged at the positions adjacent to the spare wire-dedicated first terminal parts 20B. Note that, the portions of the first wires 25 arranged at the source-side flexible printed circuit boards 18 are arranged to detour the source drivers 21.

As shown in FIG. 3, the second wires 26 are arranged exclusively on the array substrate 11B. The second wires 26 have the divided structure consisting of: first division second wires 26A crossing the source lines 17; and second division second wires 26B crossing third wires 27 that will be described later. The first division second wires 26A extend in the X-axis direction to cross other end side of the source lines 17 via the insulating film IN in the non-display region NAA of the array substrate 11B and then bent and extend so as to be distanced from the display region AA. Note that, the portions of the first division second wires 26A extending in the X-axis direction are each made of the first metal film M1, and the portions of the first division second wires 26A extending in the Y-axis direction are each made of the second metal film M2. The overlapping portions (the bent part) between these portions are connected to each other each at a contact hole (not shown) opened at the insulating film IN. The second division second wires 26B extend in the X-axis direction to cross other end of the first division second wires 26A on the side opposite to the source lines 17 side via the insulating film IN in the non-display region NAA of the array substrate 11B. At the position where the second division second wires 26B reach the end (corner) in the X-axis direction of the array substrate 11B, the second division second wires 26B are bent crank-like, including ends arranged at the positions adjacent to the second terminal parts 22 (spare wire-dedicated second terminal parts 22B that will be described later).

Figure 5:
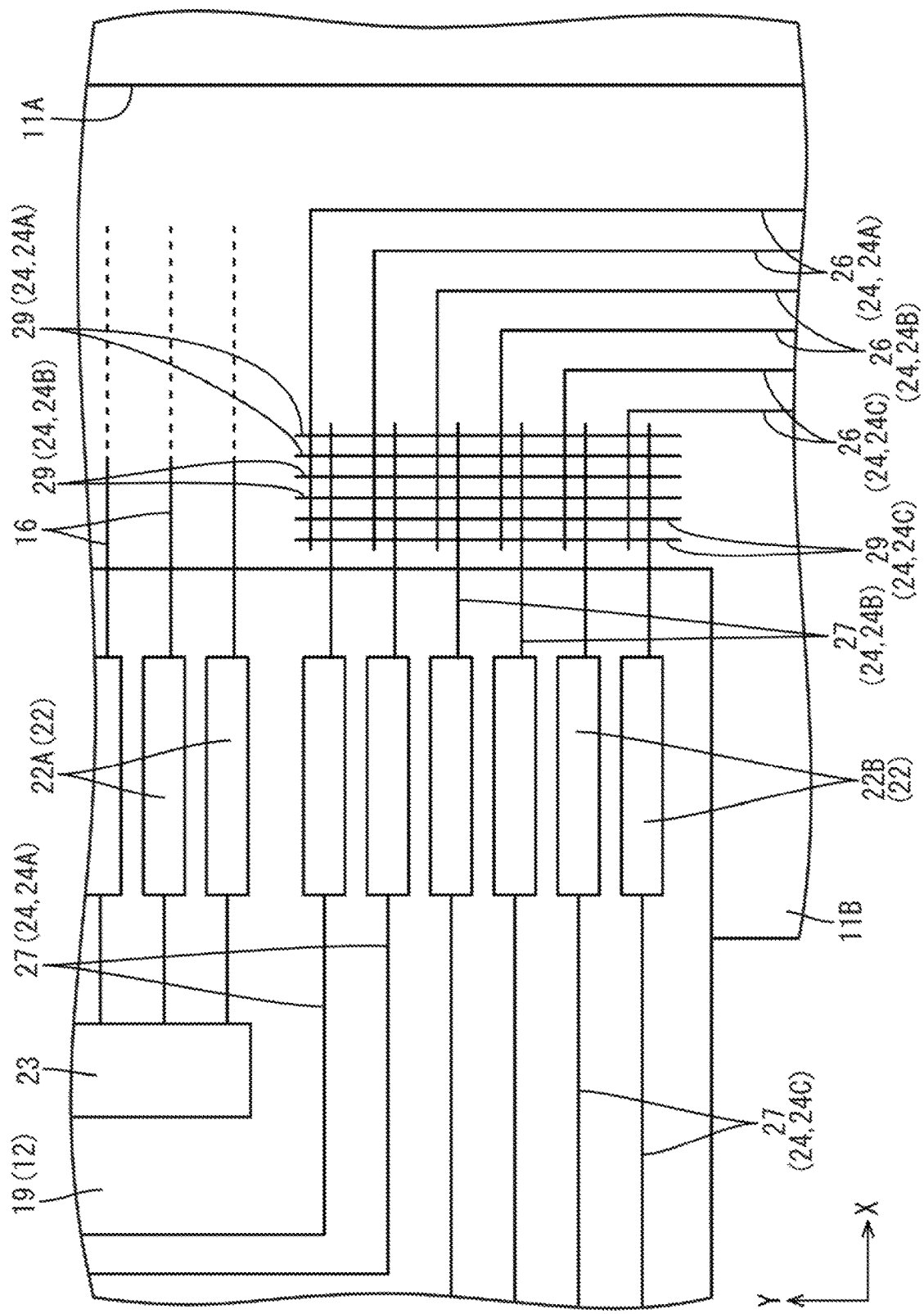
FIG. 5 is an enlarged plan view around a corner part in the liquid crystal panel where fifth wires being spare wires are arranged.

As shown in FIG. 3, the third wires 27 are routed across the array substrate 11B and the gate-side flexible printed circuit boards 19. Accordingly, the second terminal parts 22 of the array substrate 11B include, in addition to the gate line-dedicated second terminal parts 22A, the spare wire-dedicated second terminal parts 22B connected to the third wires 27. Specifically, the third wires 27 are routed, in the non-display region NAA in the array substrate 11B, from the end portions (second end portions) of the first wires 25 being adjacent to the spare wire-dedicated first terminal parts 20B to the end portions (second end portions) of the second wires 26 being adjacent to the spare wire-dedicated second terminal parts 22B, to pass through all the four gate-side flexible printed circuit boards 19 mounted on the short side part of the array substrate 11B. In more detail, as shown in FIGS. 3 and 4, the third wires 27 are arranged including first end portions arranged in parallel to the second end portions of the first wires 25 while being arranged in the X-axis direction that crosses an extending direction in which the first end portions of the third wires 27 extend (the Y-axis direction). Then, the third wires 27 extend in the Y-axis direction and then bent outward, and connected to the spare wire-dedicated second terminal parts 22B mounted on the gate-side flexible printed circuit board 19 nearest to the source-side flexible printed circuit board 18 in the Y-axis direction. As shown in FIG. 3, the third wires 27 are routed from the spare wire-dedicated second terminal parts 22B to the gate-side flexible printed circuit board 19 nearest to the source-side flexible printed circuit board 18. At this time, the third wires 27 are arranged so as to detour the gate driver 23 in the gate-side flexible printed circuit board 19, specifically, folded so as to surround the gate driver 23 on three sides excluding the gate line-dedicated second terminal parts 22A side. The third wires 27 are connected to the spare wire-dedicated second terminal parts 22B of the array substrate 11B from the gate-side flexible printed circuit board 19, and then routed to be folded back in the portion between the gate-side flexible printed circuit boards 19 adjacent to each other in the Y-axis direction. The third wires 27 are connected to the spare wire-dedicated second terminal parts 22B mounted on the gate-side flexible printed circuit board 19 adjacent to the gate-side flexible printed circuit board 19 nearest to the source-side flexible printed circuit board 18. The third wires 27 are routed in the above-described manner in every gate-side flexible printed circuit board 19, and in every portion between the gate-side flexible printed circuit boards 19 adjacent to each other in the Y-axis direction in the array substrate 11B. Then, as shown in FIG. 5, the third wires 27 are routed to the gate-side flexible printed circuit board 19 farthest from the source-side flexible printed circuit board 18, and then connected to the spare wire-dedicated second terminal parts 22B. The third wires 27 extend from the spare wire-dedicated second terminal parts 22B along the X-axis direction and in the direction opposite to the gate-side flexible printed circuit boards 19, including end portions (second end portions) arranged at the positions adjacent to the spare wire-dedicated second terminal parts 22B. The third wires 27 are arranged including second end portions arranged in parallel to the second end portions of the second wires 26 while being arranged in the Y-axis direction that crosses an extending direction in which the second ends of the third wires 27 extend (the X-axis direction).

Figure 6:
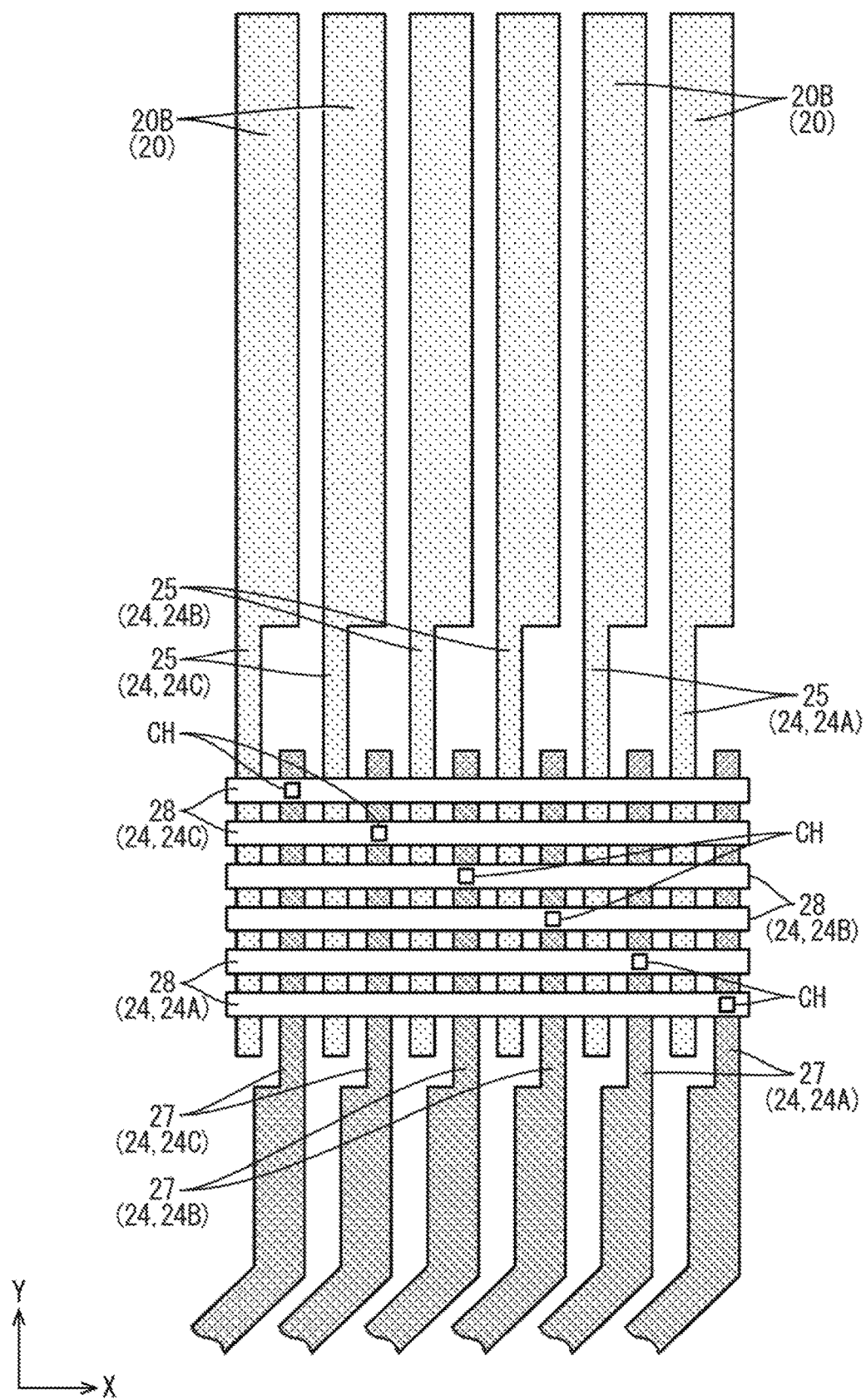
FIG. 6 is a plan view showing the relationship among first wires, third wires, and the fourth wires being spare wires.

As shown in FIG. 4, the fourth wires 28 are arranged to be adjacent to the source-side flexible printed circuit board 18 positioned at the end in the X-axis direction in the non-display region NAA of the array substrate 11B. As shown in FIG. 6, the fourth wires 28 are arranged to cross the second end portions of the first wires 25 and the first end portions of the third wires 27 arranged in the X-axis direction, so as to extend linearly in the X-axis direction (the direction in which the second end portions of the first wires 25 and the second end portions of the third wires 27 extend). Note that, FIG. 6 shows the first wires 25 and the third wires 27 with different hatches. Specifically, the first wires 25 and the third wires 27 each being six in number are arranged including respective second end portions and first end portions alternately arranged in the X-axis direction, whereas the fourth wires 28 cross all the first wires 25 and third wires 27 being twelve in number in total. The fourth wires 28 are arranged at a certain interval in the Y-axis direction by the number as many as the number of the crossing first wires 25 and third wires 27, that is, six in number. The overlapping portions between the fourth wires 28 and the first wires 25 and between the fourth wires 28 and the third wires 27 are arranged at a certain interval in the X-axis direction and the Y-axis direction in a matrix.

As shown in FIG. 8, the fourth wires 28 are each made of the second metal film M2 arranged on the upper layer side, via the insulating film IN, relative to the first metal film M1 forming each of the first wires 25 and the third wires 27. Note that, FIG. 8 show the first wires 25 (the second wires 26) and the third wires 27 with different hatches. Then, as shown in FIGS. 6 and 8, the six fourth wires 28 are respectively connected to specific ones of the six crossing third wires 27 via the contact holes CH opened at the insulating film IN. That is, the six fourth wires 28 and the six third wires 27 are previously individually connected. Note that, in FIG. 6, the open squares in the drawing respectively represent the contact holes CH. Specifically, for example, as to the first spare wires 24A to the third spare wires 24C being two in number each shown in FIG. 6, the first wires 25 and the third wires 27 structuring the first spare wires 24A are arranged on the right end side in FIG. 6. The first wires 25 and the third wires 27 structuring the third spare wires 24C are arranged on the left end side in FIG. 6. The first wires 25 and the third wires 27 structuring the second spare wires 24B are arranged on the central side in FIG. 6. Then, the contact holes CH are arranged at, out of the six fourth wires 28: the overlapping portions between the fourth wires 28 on the far end side from the spare wire-dedicated first terminal parts 20B in the Y-axis direction and the third wires 27 structuring the first spare wires 24A; the overlapping portions between the fourth wires 28 on the near end side to the spare wire-dedicated first terminal parts 20B in the Y-axis direction and the third wires 27 structuring the third spare wires 24C; and the overlapping portions between the fourth wires 28 on the central side in the Y-axis direction and the third wires 27 structuring the second spare wires 24B. The six contact holes CH are linearly arranged in a diagonal direction relative to the X-axis direction and the Y-axis direction as seen in a plan view. Note that, while not specifically shown in the drawings, the first wires 25, the third wires 27, and the fourth wires 28 in relation to the fourth spare wires 24D to the sixth spare wires 24F are also arranged similarly to the first spare wires 24A to the third spare wires 24C described with reference to FIG. 6.

As shown in FIG. 5, the fifth wires 29 are arranged to be adjacent to the gate-side flexible printed circuit board 19 farthest from the source-side flexible printed circuit board 18 in the Y-axis direction in the non-display region NAA in the array substrate 11B. As shown in FIG. 7, the fifth wires 29 are arranged to linearly extend in the Y-axis direction (the direction in which second end portions of the second wires 26 and second end portions of the third wires 27 extend) to cross the second end portions of the second wires 26 and the second end portions of the third wires 27 arranged in the Y-axis direction. Note that, FIG. 7 shows the second wires 26 and the third wires 27 with different hatches. Specifically, the second wires 26 and the third wires 27 each being six in number are arranged including respective second end portions alternately arranged in the Y-axis direction, whereas the fifth wires 29 cross all the second wires 26 and the third wires 27 being twelve in number in total. The fifth wires 29 are arranged at a certain interval in the X-axis direction by the number as many as the number of the crossing second wires 26 and the third wires 27, that is, six in number. The overlapping portions between the fifth wires 29 and the second wires 26 and between the fifth wires 29 and the third wires 27 are arranged at a certain interval in the X-axis direction and the Y-axis direction in a matrix.

As shown in FIG. 8, the fifth wires 29 are each made of the second metal film M2 arranged on the upper layer side, via the insulating film IN, relative to the first metal film M1 forming each of the second wires 26 and the third wires 27. Note that, since the cross-sectional structure of the fifth wires 29 is substantially identical to the cross-sectional structure of the above-described fourth wires 28, FIG. 8 is applied to the description of the fifth wires 29. Then, as shown in FIGS. 7 and 8, the six fifth wires 29 are respectively connected to specific ones of the six crossing second wires 26 via the contact holes CH opened at the insulating film IN. That is, the six fifth wires 29 and the six second wires 26 are previously individually connected. Note that, in FIG. 7, the open squares in the drawing respectively represent the contact holes CH. Specifically, for example, as to the first spare wires 24A to the third spare wires 24C each being two in number shown in FIG. 7, the second wires 26 and the third wires 27 structuring the first spare wires 24A are arranged on the upper end side in FIG. 7. The second wires 26 and the third wires 27 structuring the third spare wires 24C are arranged on the lower end side in FIG. 7. The second wires 26 and the third wires 27 structuring the second spare wires 24B are arranged on the central side in FIG. 7. Then, the contact holes CH are arranged at, out of the six fifth wires 29: the overlapping portions between the fifth wires 29 on the far end side from the spare wire-dedicated second terminal part 22B in the X-axis direction and the second wires 26 structuring the first spare wires 24A; the overlapping portions between the fifth wires 29 on the near end side to the spare wire-dedicated second terminal parts 22B in the X-axis direction and the second wires 26 structuring the third spare wires 24C; and the overlapping portions between the fifth wires 29 on the central side in the X-axis direction and the second wires 26 structuring the second spare wires 24B. The six contact holes CH are linearly arranged in a diagonal direction relative to the X-axis direction and the Y-axis direction as seen in a plan view. Note that, while not specifically shown in the drawings, the second wires 26, the third wires 27, and the fifth wires 29 in relation to the fourth spare wires 24D to the sixth spare wires 24F are also arranged similarly to the first spare wires 24A to the third spare wires 24C described with reference to FIG. 7.

Subsequently, a description will be given of repair when any source line 17 suffers a wire breakage. In the following, while FIG. 3 shows an exemplary case where a source line 17 arranged in the third section display region AA3 suffers a wire breakage, the description holds true for the case where a source line 17 arranged in any of other section display regions AA1, AA2, AA4 to AA6 suffers a wire breakage. Note that, mark "x" in FIG. 3 represents the location of the wire breakage. When a wire breakage occurs at one source line 17 arranged in the third section display region AA3, repair is performed using the third spare wires 24C arranged at a location where they can be short-circuited to the broken source line 17. In the following, the third spare wires 24C including the first wires 25 and the second wires 26 crossing the source line 17 suffering the wire breakage is referred to as the "repair-target third spare wires 24C". Specifically, the overlapping portions between first end portions of the first wires 25 and the second wires 26 structuring the repair-target third spare wires 24C and a first end portion and a second end portion of the source line 17 suffering the wire breakage are irradiated with laser light from the array substrate 11B side in the Z-axis direction, such that the interposed insulating film IN is broken and electrical conduction is established at each of the overlapping portions. Thus, the first wires 25 and the second wires 26 structuring the repair-target third spare wires 24C are short-circuited to the source line 17 suffering the wire breakage. Note that, as to the second wires 26 being the target of the short-circuiting process, the overlapping portion between the first division second wire 26A and the second division second wire 26B is irradiated with laser light (the short-circuiting process), whereby the wires 26A, 26B are short-circuited to each other. Note that, a solid filled circle in FIG. 3 represents the laser light-irradiated location (the short-circuited location).

Figure 9:
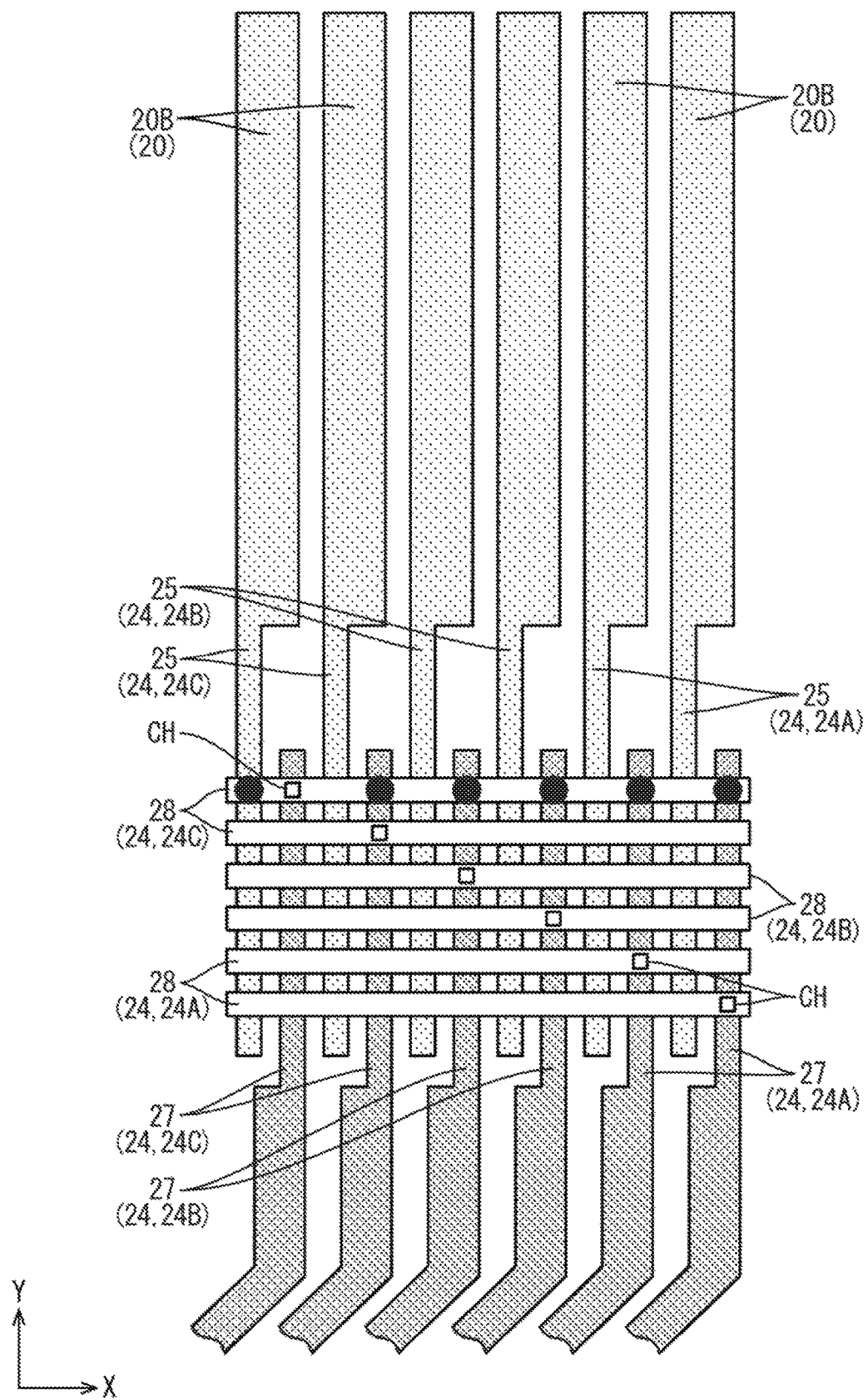
FIG. 9 is a plan view showing the state where a short-circuiting process is performed on each of predetermined overlapping portions among the first wires, the third wires, and the fourth wire being spare wires.

On the other hand, as shown in FIGS. 8 and 9, the fourth wire 28 connected to the third wire 27 structuring the repair-target third spare wire 24C through the contact hole CH is short-circuited to, in addition to the first wire 25 structuring the repair-target third spare wire 24C, five third wires 27 respectively structuring other spare wires 24A, 24B, 24C not being the repair target. Note that, solid filled circles in FIGS. 8 and 9 represent the laser light-irradiated locations (short-circuited locations). Specifically, the overlapping portion between the fourth wire 28 and a first end portion of one first wire 25 structuring the third spare wire 24C described above, and the overlapping portions between the fourth wire 28 and first end portions of other five third wires 27 structuring the spare wires 24A, 24B, 24C are irradiated with laser light, whereby electrical conduction is established at each of the overlapping portions. At this time, since the laser light-irradiated locations are linearly arranged in the extending direction of the fourth wire 28 (the X-axis direction), the laser light irradiation work can be carried out within a short time, that is, workability is excellent. Thus, the first wire 25 structuring the repair-target third spare wire 24C is short-circuited to all the six third wires 27 through one fourth wire 28.

Figure 10:
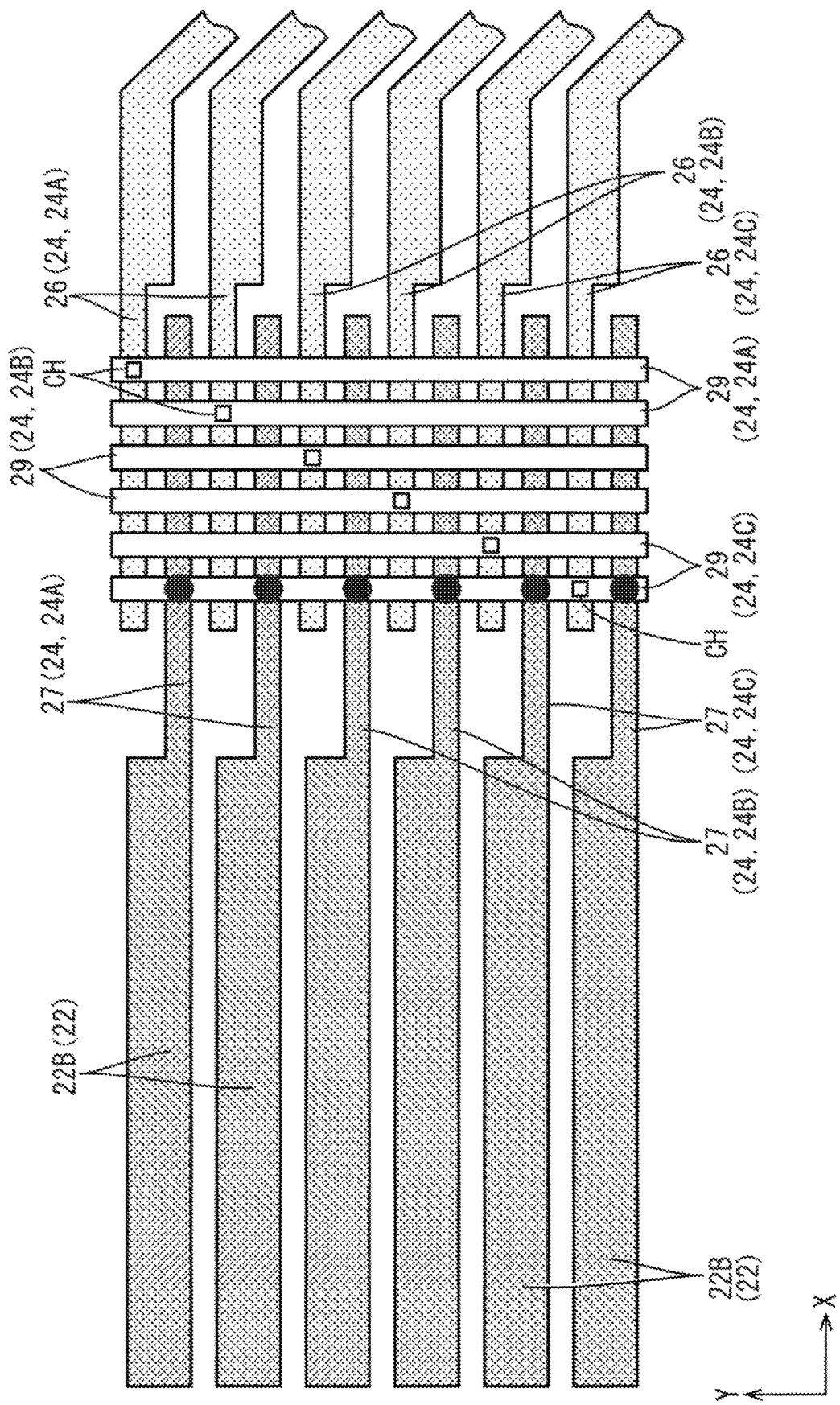
FIG. 10 is a plan view showing the state where a short-circuiting process is performed on each of predetermined overlapping portions among the second wires, the third wires, and the fifth wire being spare wires.

Further, as shown in FIGS. 8 and 10, the fifth wire 29 connected to the second wire 26 structuring the repair-target third spare wire 24C through the contact hole CH is short-circuited to, in addition to the third wire 27 structuring the repair-target third spare wire 24C, five third wires 27 respectively structuring other spare wires 24A, 24B, 24C not being the repair target. Note that, solid filled circles in FIG. 10 represent the laser light-irradiated locations (short-circuited locations). Specifically, the overlapping portions between the fifth wire 29 and second end portions of the six third wire 27 are irradiated with laser light, whereby electrical conduction is established at each of the overlapping portions. At this time, since the laser light-irradiated locations are linearly arranged in the extending direction of the fifth wire 29 (the Y-axis direction), the laser light irradiation work can be carried out within a short time, that is, workability is excellent. Thus, the second wire 26 structuring the repair-target third spare wire 24C is short-circuited to all the six third wires 27 via one fifth wire 29. From the foregoing, an image signal transmitted to the first wire 25 structuring the repair-target third spare wire 24C is transmitted to, in addition to the third wire 27 structuring the repair-target third spare wire 24C, also other five third wires 27 via the fourth wire 28 as shown in FIG. 9, and thereafter transmitted just to the second wire 26 structuring the repair-target third spare wire 24C via the fifth wire 29 as shown in FIG. 10. Accordingly, as compared to the case where, for example, an image signal is transmitted to just one third wire 27, the trace resistance attributed to the image signal transmitting through the third wire 27 is reduced to about ⅙ as great as the trace resistance in that case. Hence, in the source line 17 suffering the wire breakage, an image signal supplied via the third spare wire 24C to a portion on a side opposite to the source driver 21 with reference to the wire breakage location becomes less prone to be edge-rounded. In particular, for example, the embodiment is useful for a large-size liquid crystal display device 10 whose screen measures about 70 inches to 100 inches, because the creepage distance of the spare wires 24 is long whereby the trace resistance tends to be great in this kind of large-size device. Further, the embodiment is useful for a high-definition liquid crystal display device 10 with the resolution of "4K" or "8K" that includes a greater number of flexible printed circuit boards 12, because the creepage distance of the spare wires 24 is long whereby the trace resistance tends to be great in this kind of high-definition device. Note that, it goes without saying that the order of performing the laser irradiation (the short-circuiting process) on the wires 25 to 29 is not necessarily identical to the order described above.

Figure 11:
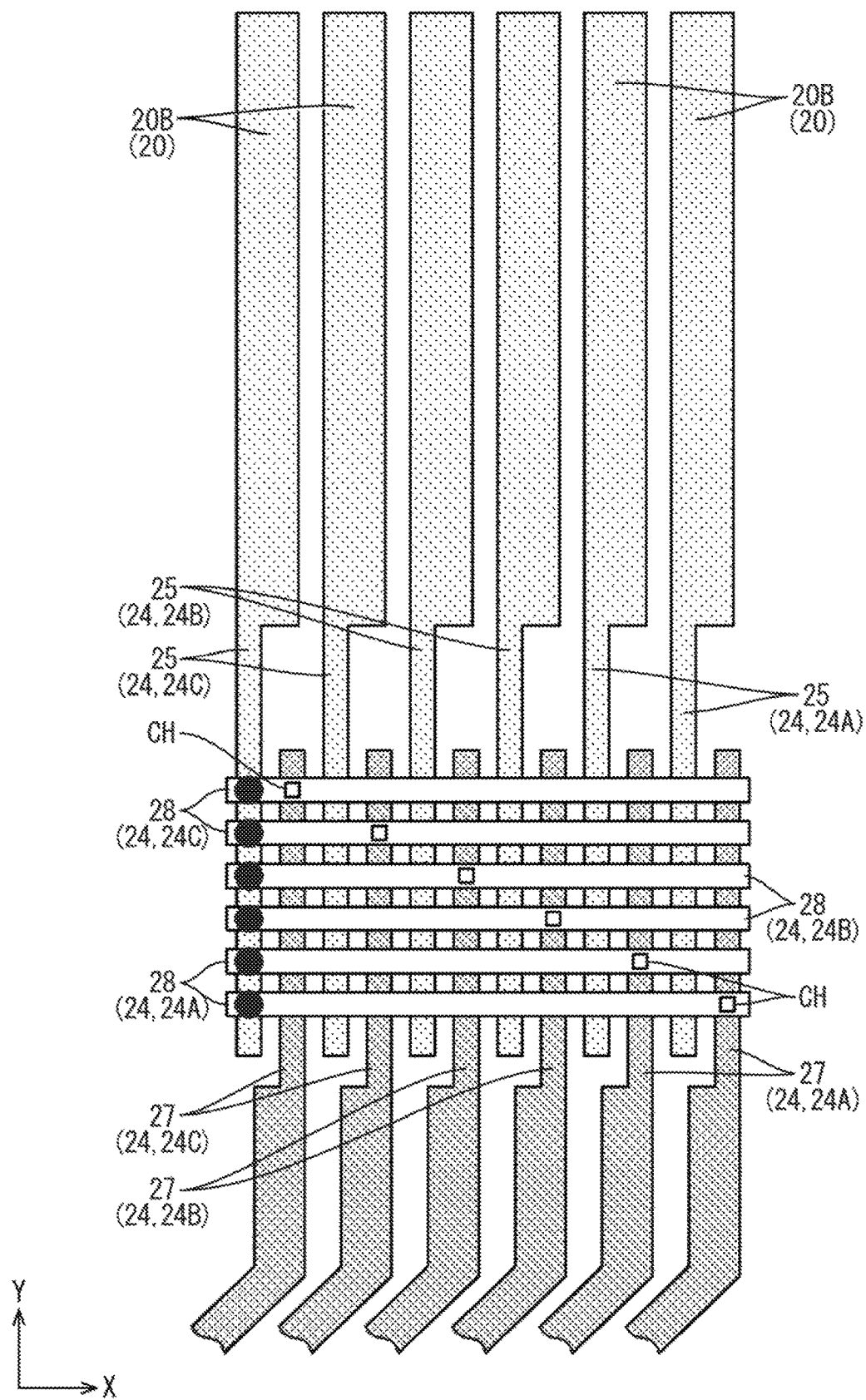
FIG. 11 is a plan view showing an exemplary case where a change is made on short-circuiting process locations for the first wire, the third wires, and the fourth wires being spare wires.

The laser light-irradiated locations on the wires 25 to 29 are not specified to those in the above description. For example, as shown in FIG. 11, all the six fourth wires 28 may be short-circuited to a second end portion of the first wire 25 structuring the repair-target third spare wire 24C. Note that, solid filled circles in FIG. 11 represent the laser light-irradiated locations (short-circuited locations). In this case, the overlapping portions between the second end portion of the first wire 25 structuring the repair-target third spare wire 24C and the six fourth wires 28 are irradiated with laser light, whereby electrical conduction is established at each of the overlapping portions. At this time, since the laser light-irradiated locations are linearly arranged in the extending direction of the first wire 25 (the Y-axis direction), the laser light irradiation work can be carried out within a short time, that is, workability is excellent. Thus, the first wire 25 structuring the repair-target third spare wire 24C is short-circuited to all the six third wires 27 via the six fourth wires 28.

Figure 12:
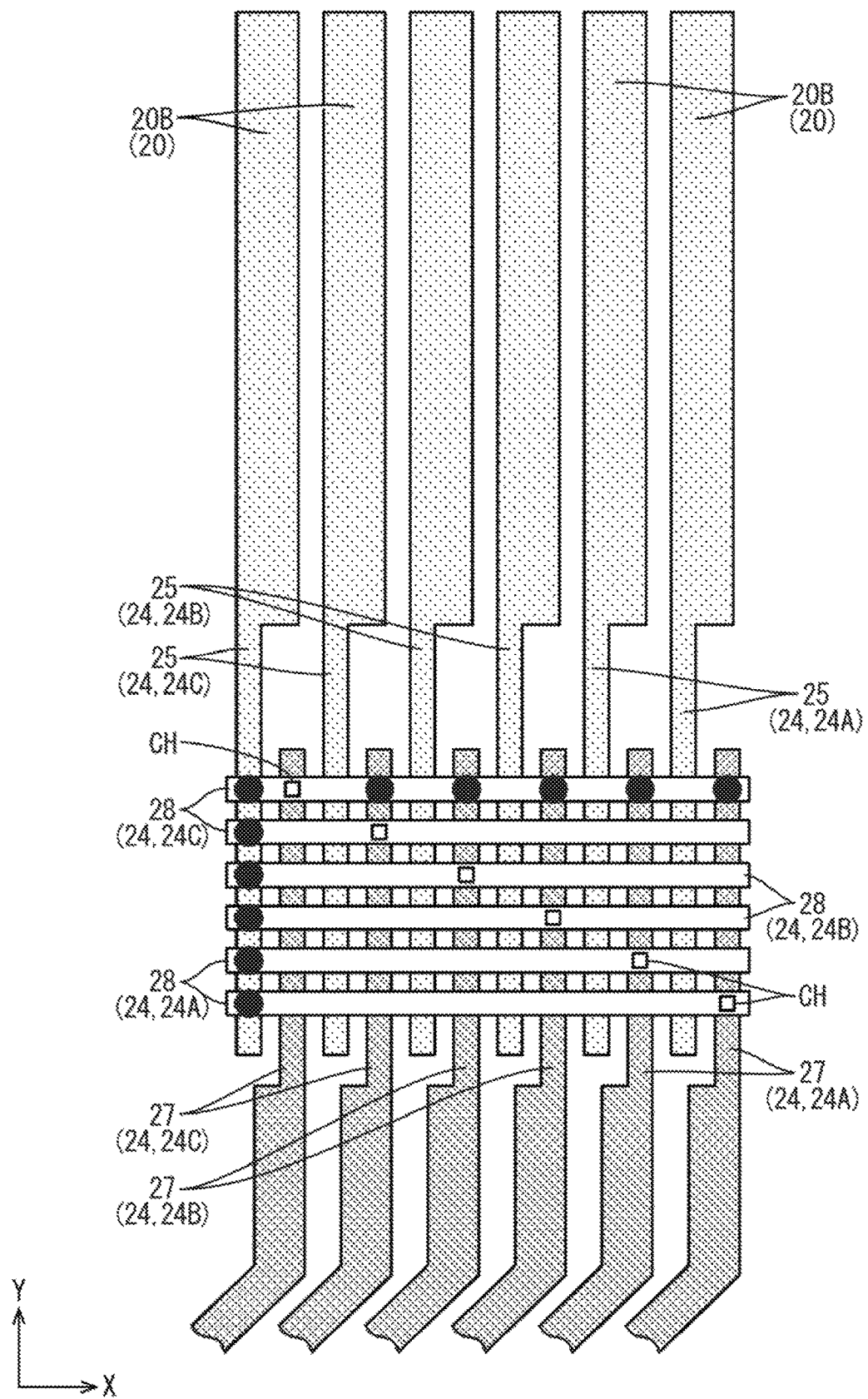
FIG. 12 is a plan view showing another exemplary case where a change is made on the short-circuiting process locations for the first wire, the third wires, and the fourth wires being spare wires.

Without being limited to the mode shown in FIG. 11, for example, as shown in FIG. 12, in addition to the fourth wire 28 connected to the third wire 27 structuring the repair-target third spare wire 24C through the contact hole CH being short-circuited to five third wires 27 structuring other spare wires 24A, 24B, 24C not being the repair target, all the six fourth wires 28 may be short-circuited to the second end portion of the first wire 25 structuring the repair-target third spare wire 24C. Note that, solid filled circles in FIG. 12 represent the laser light-irradiated locations (short-circuited locations). In this case, the overlapping portions between the fourth wire 28 connected to the third wire 27 structuring the repair-target third spare wire 24C through the contact hole CH and first end portions of the five third wires 27 structuring other spare wires 24A, 24B, 24C are irradiated with laser light. Further, the overlapping portions between the second end portion of the first wire 25 structuring the repair-target third spare wire 24C and the six fourth wires 28 are irradiated with laser light. By the irradiation, electrical conduction is established at each of the overlapping portions. In this mode, the first wire 25 structuring the repair-target third spare wire 24C is connected to the fourth wires 28 at six locations. Further, the fourth wire 28 connected to the third wire 27 structuring the repair-target third spare wire 24C through the contact hole CH is connected to the third wires 27 at six locations. Thus, the trace resistance further reduces, and excellent redundancy is exhibited.

Figure 13:
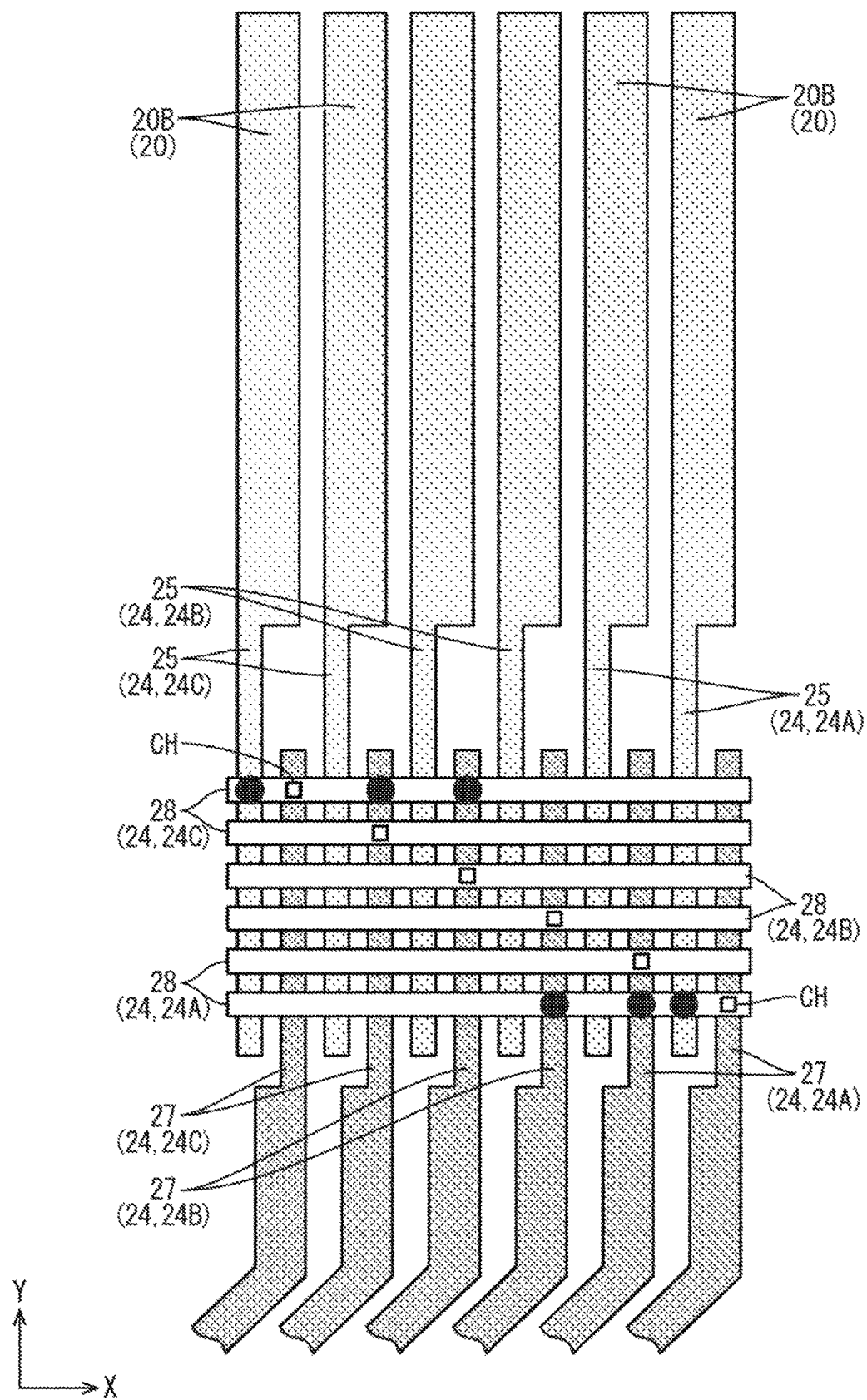
FIG. 13 is a plan view showing the state where a short-circuiting process is performed on each of predetermined overlapping portions among the first wires, the third wires, and the fourth wires being spare wires upon a wire breakage of two source lines.

Subsequently, a description will be given of repair when two source lines 17 each suffer a wire breakage. While the following exemplarily show the case where, in addition to one source line 17 arranged in the third section display region AA3, one source line 17 arranged in the first section display region AA1 also suffers a wire breakage, the same holds true for the case where two source lines 17 belonging to different section display regions AA1 to AA3 (AA4 to AA6) each suffer a wire breakage or two source lines 17 belonging to the same section display regions AA1 to AA3 (AA4 to AA6) each suffer a wire breakage. When one source line 17 arranged in the first section display region AA1 and one source line 17 arranged in the third section display region AA3 each suffer a wire breakage, these source lines 17 are repaired using a first spare wire 24A and a third spare wire 24C arranged at a location where they can be short-circuited to these source lines 17. Specifically, the overlapping portions between first end portions of the first wire 25 and the second wire 26 structuring the repair-target first spare wire 24A and third spare wire 24C, and first end portions and second end portions of the source lines 17 each suffering the wire breakage, respectively, are irradiated with laser light, such that electrical conduction is established at each of the overlapping portions. On the other hand, as shown in FIG. 13, the fourth wires 28 connected to the third wires 27 structuring the repair-target first spare wire 24A and third spare wire 24C through the contact holes CH are short-circuited to, in addition to the first wires 25 structuring the repair-target first spare wire 24A and third spare wire 24C, the third wires 27 structuring other non-repair-target spare wires 24A, 24B, 24C being two in number each. Note that, solid filled circles in FIG. 13 represent the laser light-irradiated locations (short-circuited locations). Specifically, the overlapping portion between the fourth wire 28 connected to the third wire 27 structuring the repair-target first spare wire 24A through the contact hole CH and a first end portion of one first wire 25 structuring the first spare wire 24A, and the overlapping portions between that fourth wire 28 and first end portions of two third wires 27 structuring other first spare wire 24A and second spare wire 24B are irradiated with laser light, whereby electrical conduction is established at each of the overlapping portions. Additionally, the overlapping portion between the fourth wire 28 connected to the third wire 27 structuring the repair-target third spare wire 24C through the contact hole CH and one first wire 25 structuring the third spare wire 24C, and the overlapping portions between that fourth wire 28 and first end portions of two third wires 27 structuring other second spare wire 24B and third spare wire 24C are irradiated with laser light, whereby electrical conduction is established at each of the overlapping portions. Thus, the first wire 25 structuring the repair-target first spare wire 24A is short-circuited to three third wires 27 via one fourth wire 28, and the first wire 25 structuring the repair-target third spare wire 24C is short-circuited to three third wires 27 via one fourth wire 28. Further, while not shown in the drawing, in the similar manner, the fifth wire 29 connected to the second wire 26 structuring the repair-target first spare wire 24A through the contact hole CH is short-circuited to, in addition to the third wire 27 structuring the repair-target first spare wire 24A, two third wires 27 structuring the non-repair-target first spare wire 24A and second spare wire 24B. Similarly, the fifth wire 29 connected to the second wire 26 structuring the repair-target third spare wire 24C through the contact hole CH is short-circuited to, in addition to the third wire 27 structuring the repair-target third spare wire 24C, two third wires 27 structuring the non-repair-target second spare wire 24B and third spare wire 24C. From the foregoing, as compared to the case where, for example, an image signal is transmitted to just one third wire 27, the trace resistance attributed to the image signal transmitting through the repair-target first spare wire 24A and third spare wire 24C is reduced to about ⅓ as great as the trace resistance in that case.

As has been described above, a liquid crystal display device (display device) 10 according to the present embodiment includes: source lines (display wires) 17; first wires 25 including first end portions overlapped with first ends of the source lines 17 via an insulating film IN; second wires 26 including first end portions overlapped with second end portions of the source lines 17 via the insulating film IN; third wires 27 routed from second end portions of the first wires 25 to second end portions of the second wires 26; a fourth wire 28 overlapping with the second end portions of the first wires 25 and first end portions of the third wires 27 via the insulating film IN; and a fifth wire 29 overlapping with the second end portions of the second wires 26 and second end portions of the third wires 27 via the insulating film IN.

In this mode, when any of the source lines 17 suffers a wire breakage or the like, a short circuit is established by a short-circuiting process such as laser irradiation between a first end portion and a second end portion of the source line 17 suffering the wire breakage out of the source lines 17 and first end portions of the first wires 25 and first end portions of the second wires 26 respectively overlapping with the broken source line 17 via the insulating film IN. Further, a short circuit is established by a short-circuiting process between second end portions of the short-circuited first wires 25 and the fourth wire 28 overlapping with the short-circuited first wires 25 via the insulating film IN. Further, a short circuit is established by a short-circuiting process between the short-circuited fourth wire 28 and first end portions of the third wires 27 overlapping with the short-circuited fourth wire 28 via the insulating film IN. Then, a short circuit is established by a short-circuiting process between second end portions of the short-circuited second wires 26 and the fifth wire 29 overlapping with the short-circuited second wires 26 via the insulating film IN. Further, a short circuit is established by a short-circuiting process between the short-circuited fifth wire 29 and second end portions of the third wires 27 overlapping with the short-circuited fifth wire 29 via the insulating film IN. Thus, the source line 17 suffering a wire breakage or the like can be supplied with a signal via the first wires 25, the second wires 26, the third wires 27, the fourth wire 28, and the fifth wire 29.

Here, the repair of the source line 17 as described above may be performed on just part of the source lines 17. In this case, for example, by a short-circuiting process, the fourth wire 28 and the fifth wire 29 are short-circuited to third wires 27, which fourth wire 28 and fifth wire 29 are respectively overlapping with second end portions of the first wires 25 and second end portions of the second wires 26, which first wires 25 and second wires 26 respectively overlapping with a first end portion and a second end portion of the repair-target source line 17 suffering a wire breakage. Thus, by virtue of the repair-target source line 17 being supplied with a signal through the third wires 27, the trace resistance reduces and, hence, edge-rounding of a signal becomes less prone to occur. In particular, the present embodiment is useful for a higher-definition and larger-size device. Note that, the source lines 17 not being the target of repair are avoided from being erroneously supplied with a signal that is to be supplied to the repair-target source line 17, by virtue of the first wires 25 and the second wires 26 respectively overlapping with first end portions and second end portions of the non-repair-target source lines 17 being kept in the non-short-circuit state.

Further, when any of the third wires 27 suffers a wire breakage or the like, the broken third wire 27 can be repaired. That is, a short circuit is established by a short-circuiting process between a first end portion and a second end portion of the broken repair-target third wire 27 and the fourth wire 28 and the fifth wire 29 respectively overlapping with the first end portion and the second end portion of the broken repair-target third wire 27. Further, a short circuit is established by a short-circuiting process respectively between the short-circuited fourth wire 28 and the short-circuited fifth wire 29 and first end portions and second end portions of other third wires 27 overlapping with the short-circuited fourth wire 28 and the short-circuited fifth wire 29. Thus, a signal can be transmitted, instead of the broken third wire 27, through the other third wires 27, the fourth wire 28, and the fifth wire 29.

Still further, the second end portions of the first wires 25 and the first end portions of the third wires 27 are arranged in parallel to each other and arranged in the direction crossing the extending direction. The second end portions of the second wires 26 and the second end portions of the third wires 27 are arranged in parallel to each other and arranged in the direction crossing the extending direction. The fourth wire 28 is linear to cross the extending direction of the second end portions of the first wires 25 and the first end portions of the third wires 27. The fifth wire 29 is linear to cross the extending direction of the second end portions of the second wires 26 and the second end portions of the third wires 27. Thus, by virtue of the fourth wire 28 and the fifth wire 29 both being linear, the arrangement space is suitably reduced as compared to the case where, for example, the fourth wire and the fifth wire are non-linear, such as bent midways.

Still further, the second end portions of the first wires 25 and the first end portions of the third wires 27 are alternately arranged, and the second end portions of second wires 26 and the second end portions of third wires 27 are alternately arranged. In this mode, the routing of the first wires 25, second wires 26, and third wires 27 can be simplified as compared to the case where, for example, second end portions of first wires are successively arranged and then first end portions of third wires are successively arranged; and second end portions of second wires are successively arranged and then second end portions of third wires are successively arranged.

Still further, the insulating film IN interposed between the fourth wire 28 and the first end portions of the third wires 27, and the insulating film IN interposed between the fifth wire 29 and the second end portions of the second wires 26 are each provided with a contact hole CH for connecting between the overlapping wires. In this mode, first end portions of the third wires 27 are connected to the fourth wire 28 through the contact hole CH formed at the interposed insulating film IN, and second end portions of the second wires 26 are connected to the fifth wire 29 through the contact hole CH formed at the interposed insulating film IN. Accordingly, the number of times of performing a short-circuiting process such as laser irradiation for repairing any source line 17 reduces, and excellent workability is attained.

Still further, the present embodiment further includes an array substrate (display substrate) 11B provided with at least the source lines 17 and part of the first wires 25, and a source-side flexible printed circuit board (flexible printed circuit board) 18 provided with at least part of the first wires 25 and connected to the array substrate 11B. In this mode, as compared to the case where the first wires are arranged over the entire array substrate 11B, the arrangement space for the first wires 25 in the array substrate 11B reduces by the amount of the part of the first wires 25 arranged in the source-side flexible printed circuit board 18. This is suitable for narrowing the frame region of the array substrate 11B.

Still further, the first end portions of the third wires 27 and the fourth wire 28 are arranged adjacent to the source-side flexible printed circuit board 18 in the array substrate 11B. In this mode, since first end portions of the third wires 27 and the fourth wire 28 are provided at the array substrate 11B, a short-circuiting process such as laser irradiation can be performed on the array substrate 11B. Additionally, the first end portions of the third wires 27 and the fourth wire 28 being arranged adjacent to the source-side flexible printed circuit board 18 is suitable for maximizing the creepage distance of the third wires 27. This can further reduce the trace resistance in short-circuiting the fourth wire 28 and the fifth wire 29 to the third wires 27 upon a wire breakage or the like of any source line 17.

Still further, the source-side flexible printed circuit boards 18 are connected to the array substrate 11B while being arranged at a certain interval along an end of the array substrate 11B. The present embodiment further includes a printed circuit board 13 connected to end portions of the source-side flexible printed circuit boards 18, the end portions being on the side opposite to the array substrate 11B side, the printed circuit board 13 being provided with at least part of the first wires 25. In this mode, the first wires 25 can be provided at also the printed circuit board 13 in addition to the source-side flexible printed circuit boards 18. Thus, flexibility in the size or arrangement position of the source-side flexible printed circuit boards 18 enhances, and the space for arranging the first wires 25 at the array substrate 11B further reduces. This is suitable in further narrowing the array substrate 11B.

Still further, each source-side flexible printed circuit board 18 is provided with a source driver (display driver) 21 supplying a signal to the source lines 17. In this mode, since the source-side flexible printed circuit board 18 requires the region for mounting the source driver 21, it may be difficult to secure a fully great width for each of first wires 25. However, once a broken source line 17 is repaired, a signal is supplied to the source line 17 via third wires 27. Hence, a sufficiently low trace resistance is maintained.

Still further, the present embodiment further includes: an array substrate 11B provided with at least source lines 17 and a gate line (second display wire) 16 extending so as to cross the source lines 17; and a gate-side flexible printed circuit board (second flexible printed circuit board) 19 provided with at least a gate driver (second display driver) 23 supplying the gate line 16 with a signal and part of the third wires 27, the gate-side flexible printed circuit board (second flexible printed circuit board) 19 being connected to the array substrate 11B. In this mode, since the gate-side flexible printed circuit board 19 requires the region for mounting the gate driver 23, it may be difficult to secure a fully great width for each of third wires 27. However, once a broken source line 17 is repaired, a signal is supplied to the source line 17 via third wires 27. Hence, a sufficiently low trace resistance is maintained. In particular, this is effective when the number of the gate-side flexible printed circuit boards 19 is increased as a higher-definition display device is intended, because each of the third wires 27 tends to assume higher resistance.

Still further, the gate-side flexible printed circuit boards 19 are connected to the array substrate 11B while being arranged at a certain interval along an end of the array substrate 11B, and the third wires 27 are partially arranged at a portion between adjacent ones of the gate-side flexible printed circuit boards 19 in the array substrate 11B. In this mode, the third wires 27 are arranged across the gate-side flexible printed circuit boards 19 and a portion between adjacent ones of the gate-side flexible printed circuit boards 19 in the array substrate 11B. Here, the portion between adjacent ones of the gate-side flexible printed circuit boards 19 in the array substrate 11B includes the space for arranging the gate lines (second display wires) 16 connected to the gate driver 23. Therefore, it may be difficult to fully secure the space for arranging the third wires 27, and consequently to secure a fully great width for each of the third wires 27. However, once a broken source line 17 is repaired, a signal is supplied to the source line 17 via third wires 27 and, hence, a sufficiently low trace resistance is maintained.

Still further, the second end portions of the third wires 27 and the fifth wire 29 are arranged adjacent to one of the gate-side flexible printed circuit boards 19 in the array substrate 11B, the one of the gate-side flexible printed circuit boards 19 being nearest to the second end portions of the second wires 26. In this mode, since second end portions of the third wires 27 and the fifth wire 29 are provided at the array substrate 11B, a short-circuiting process such as laser irradiation can be performed on the array substrate 11B. Then, the second end portions of the third wires 27 and the fifth wire 29 are arranged adjacent to one of the gate-side flexible printed circuit boards 19, which one is nearest to the second end portions of the second wires 26. Therefore, the third wires 27 are connected to the fifth wire 29 through all the gate-side flexible printed circuit boards 19. Accordingly, as compared to the case where, for example, the second end portions of the third wires and the fifth wire are arranged at the portion between adjacent ones of the gate-side flexible printed circuit boards 19 in the array substrate 11B, a great creepage distance is secured for each of the third wires 27. This further reduces the trace resistance when the fourth wire 28 and fifth wire 29 are short-circuited to the third wires 27 addressing to any wire breakage of a source line 17.

Still further, the first wires 25, the second wires 26, the third wires 27, the fourth wire 28, and the fifth wire 29 are identical to one another in number. In this mode, by virtue of the wires 25 to 29 being identical to one another in number, the number of the source lines 17 that can be repaired is maximized.

Second Embodiment

Figure 14:
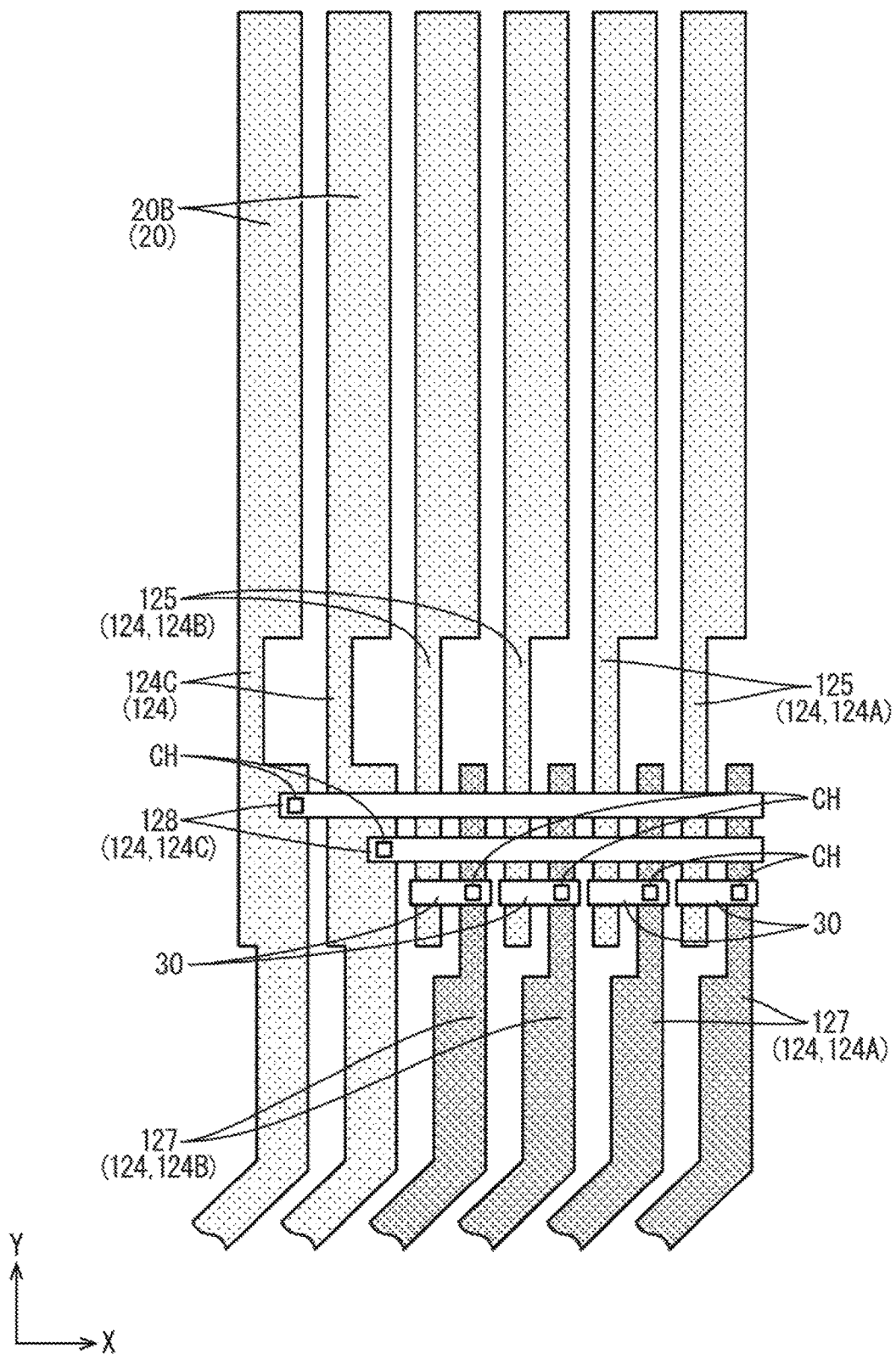
FIG. 14 is a plan view showing the relationship among first wires, third wires, and fourth wires being spare wires according to a second embodiment of the technology described herein.
Figure 15:
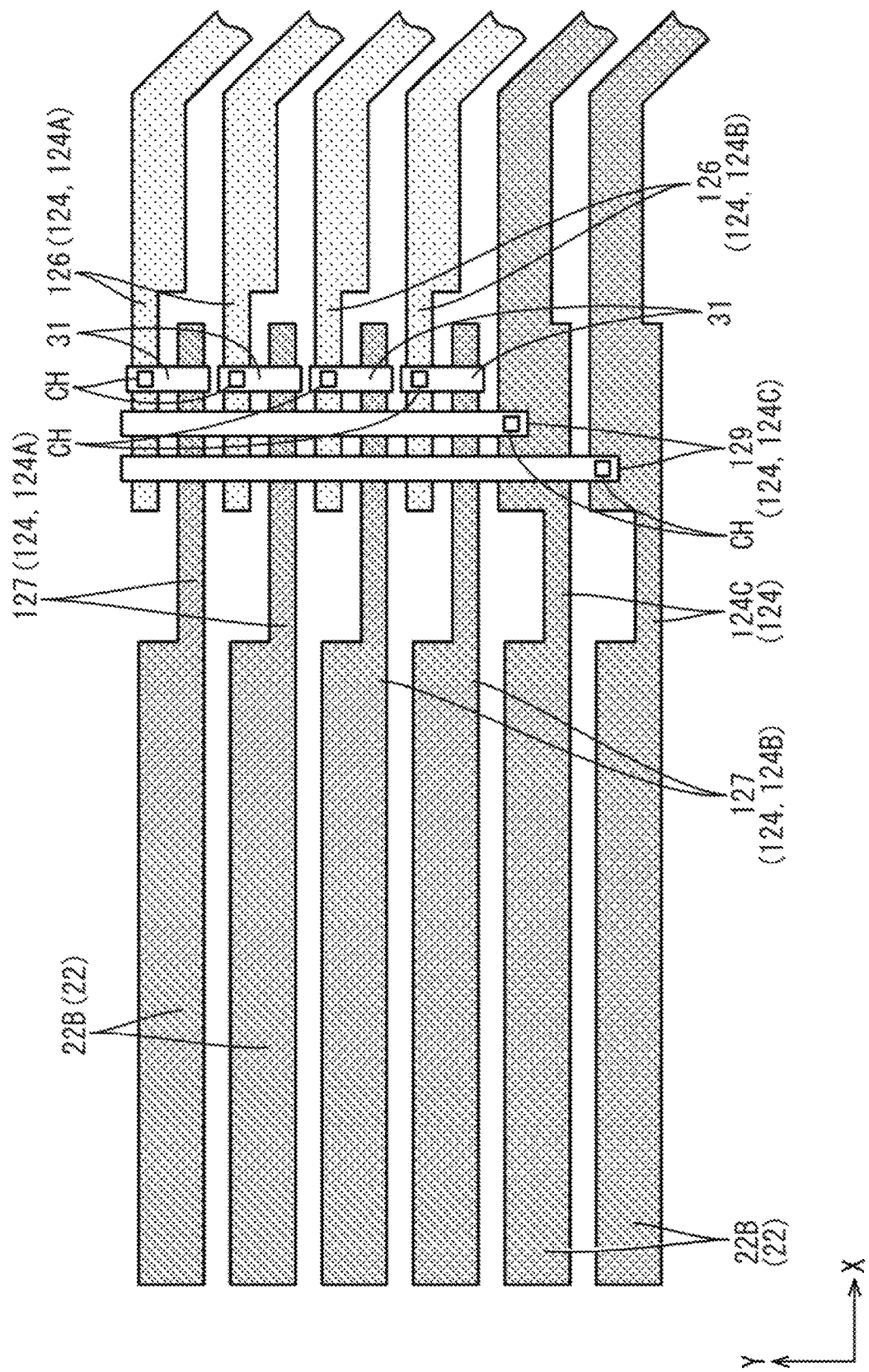
FIG. 15 is a plan view showing the relationship among second wires, the third wires, and fifth wires being spare wires.

With reference to FIGS. 14 and 15, a description will be given of a second embodiment of the technology described herein. In the second embodiment, spare wires 124 with modified structure are shown. Note that, a description of the structure, operation and effect similar to those described in the first embodiment will be omitted.

As shown in FIGS. 14 and 15, each third spare wire 124C included in the spare wires 124 according to the present embodiment is different in being a direct combination (the non-divided structure) of a first wire 125, a second wire 126, and a third wire 127 from each first spare wire 124A and each second spare wire 124B both having the divided structure. Accordingly, the third spare wires 124C each have a great width at a portion crossing the fourth wire 128 and the fifth wire 129, as compared to the width of the similar portion of the first spare wires 124A and the second spare wires 124B. The fourth wires 128 and the fifth wires 129 are provided by the number as many as the third spare wires 124C (two in number each). The fourth wires 128 and the fifth wires 129 two in number each are connected to the third spare wires 124C through the contact holes CH, respectively. The fourth wires 128 overlap with, in addition to the third spare wires 124C, all second end portions of the first wires 125 structuring two first spare wires 124A and two second spare wires 124B and first end portions of the third wires 127. The fifth wires 129 overlap, in addition to the third spare wires 124C, second end portions of the second wires 126 structuring two first spare wires 124A and two second spare wires 124B and second end portions of the third wires 127. Note that, the fourth wire 128 and the fifth wire 129 connected to the third spare wire 124C on the central side do not overlap with the third spare wire 124C on the end side.

Then, there is provided sixth wires 30 each overlap, via an insulating film (not shown), with a second end portion of one first wire 125 and with a first end portion of one third wire 127 structuring the first spare wires 124A and the second spare wires 124B, and seventh wires 31 each overlap, via an insulating film, with second end portion of one second wire 126 and a second end portion of one third wire 127 structuring the first spare wires 124A and the second spare wires 124B. The sixth wires 30 and the seventh wires 31 are each made of a second metal film. The sixth wires 30 and the seventh wires 31 are each provided by four in number individually in association with the first spare wires 124A and the second spare wires 124B. The four sixth wires 30 are arranged to align on an identical line while extending in parallel to the fourth wires 128. The sixth wires 30 are connected to first end portions of the third wires 127 structuring the first spare wires 124A and the second spare wires 124B via the contact holes CH, respectively. The four seventh wires 31 are arranged to align on an identical line while extending in parallel to the fifth wires 129. The seventh wires 31 are connected to second end portions of the second wires 126 structuring the first spare wire 124A and the second spare wires 124B via the contact holes CH, respectively. Accordingly, when any source line 17 arranged in the first section display region AA1 or the second section display region AA2 (see FIG. 3) suffers a wire breakage, second end portions of the first wires 125 and the third wires 127 of the first spare wires 124A or the second spare wires 124B overlapping with the broken source line 17 are short-circuited to the sixth wire 30 and the seventh wire 31 (see FIG. 3). Thus, the broken source line 17 is supplied with an image signal via wires 30, 31, 125, 126, 127 each one in number structuring the first spare wires 124A or the second spare wires 124B. On the other hand, when any source line 17 arranged in the third section display region AA3 (see FIG. 3) suffers a wire breakage, the fourth wire 128 and the fifth wire 129 connected to the third spare wires 124C overlapping with the broken source line 17 through the contact holes CH are short-circuited to the first end portions and second end portions of the third wires 127 structuring the non-target first spare wires 124A and second spare wires 124B (see FIG. 3). Thus, the broken source line 17 is supplied with an image signal via, in addition to the third spare wires 124C, the third wires 127 structuring the first spare wires 124A and the second spare wires 124B and, hence, the trace resistance reduces. As has been described in the first embodiment, the creepage distance is longest with the third spare wires 124C than the first spare wires 124A and the second spare wire 124B, and the trace resistance also tends to be greatest with the third spare wires 124C. Therefore, this mode is particularly useful. Furthermore, since the necessity of performing a short-circuiting process on the third spare wires 124C is eliminated, the number of times of performing the short-circuiting process reduces than in the first embodiment.

As has been described above, according to the present embodiment, the fourth wire 128 overlaps with all the second end portions of the first wires 125 and the first end portions of the third wires 127, and the fifth wire 129 overlaps with all the second end portions of the second wires 126 and the second end portions of the third wires 127. The present embodiment further includes: a sixth wire 30 overlapping with a second end portion of one of the first wires 125 and a first end portion of one of the third wires 127; and a seventh wire 31 overlapping with a second end portion of one of the second wires 126 and a second end portion of one of the third wires 127. In this mode, the sixth wire 30 and the seventh wire 31 are short-circuited to respective second end portions of one first wire 125 and one second wire 126 and to a first end portion and a second end portion of one third wire 127 by a short-circuiting process such as laser irradiation. Thus, a signal is transmitted to one first wire 125 and one second wire 126 via one third wire 127. Here, a difference in trace resistance may occur upon repairing any wire breakage among source lines 17 attributed to the arrangement or the like. The sixth wire 30 and the seventh wire 31 are preferably used in repairing the source lines 17 with which the trace resistance is relatively low, and the fourth wire 128 and the fifth wire 129 are preferably used in repairing the source line 17 with which the trace resistance is relatively high.

Third Embodiment

Figure 16:
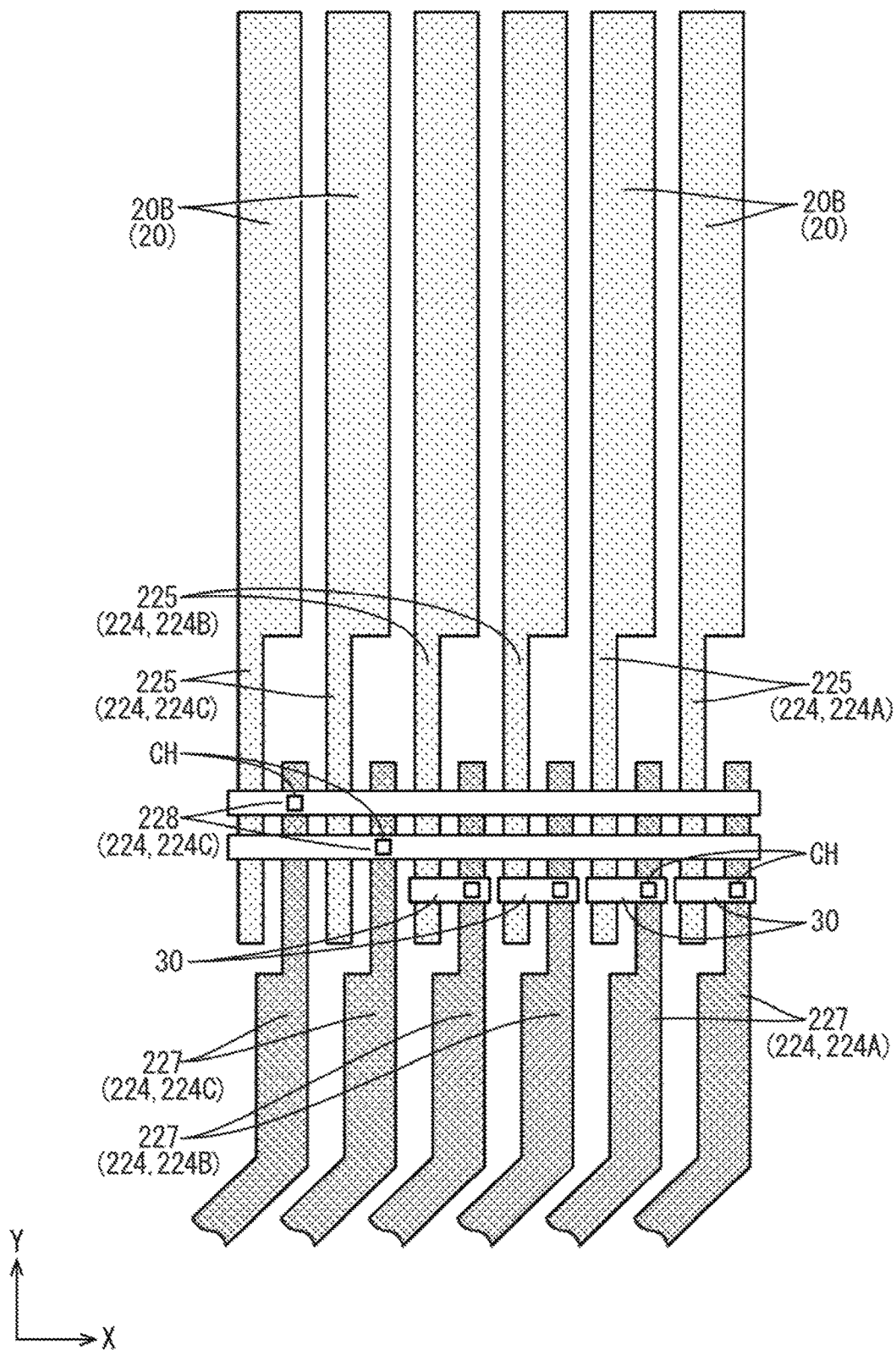
FIG. 16 is a plan view showing the relationship among first wires, third wires, and fourth wires being spare wires according to a third embodiment of the technology described herein.
Figure 17:
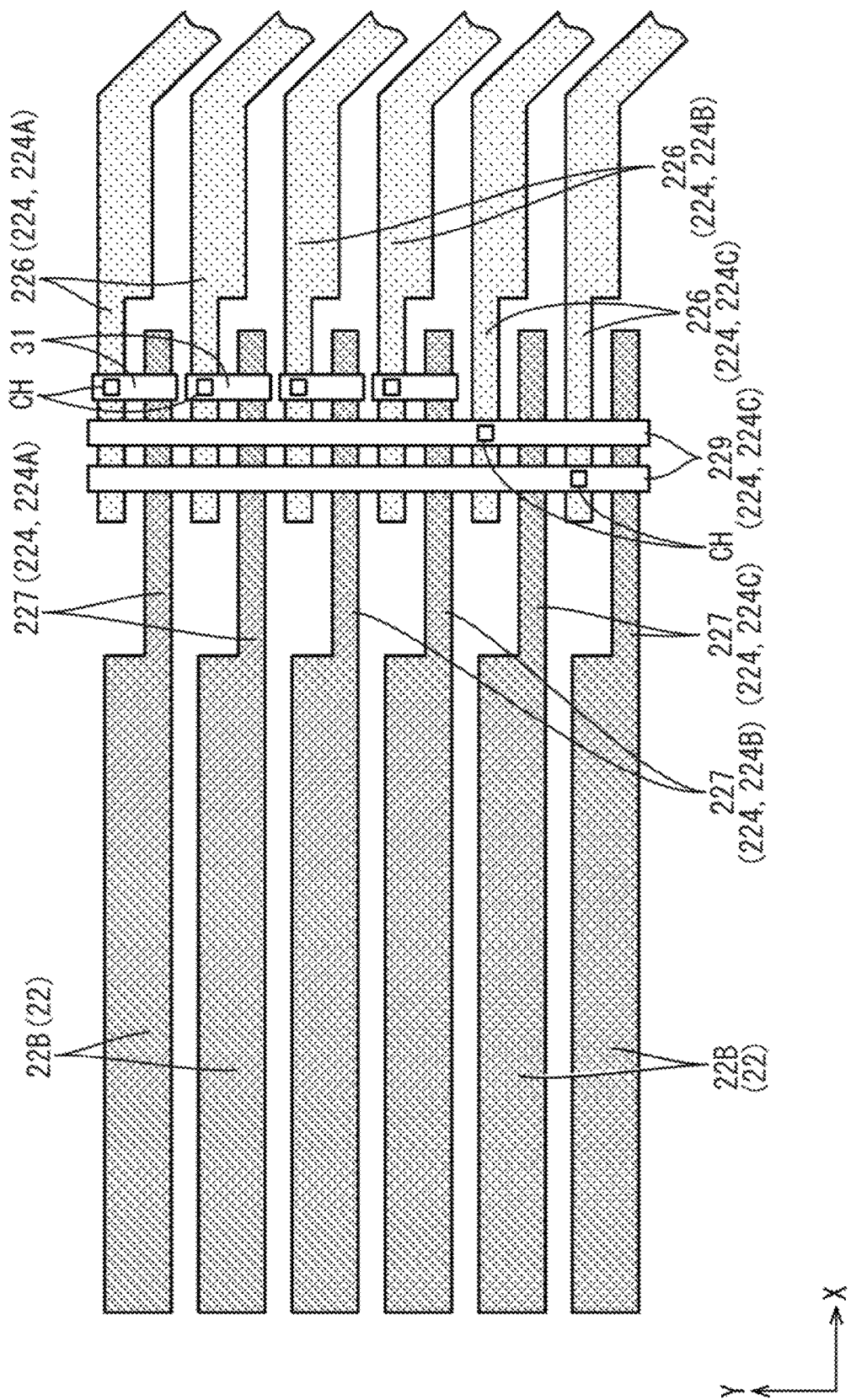
FIG. 17 is a plan view showing the relationship among second wires, the third wires, and fifth wires being spare wires.

With reference to FIGS. 16 and 17, a description will be given of a third embodiment of the technology described herein. In the third embodiment, third spare wires 224C whose structure is modified from the second embodiment are shown. Note that, a description of the structure, operation and effect similar to those described in the second embodiment will be omitted.

As shown in FIGS. 16 and 17, the third spare wires 224C included in spare wires 224 according to the present embodiment have the divided structure similarly to first spare wires 224A and second spare wires 224B. Similarly to those described in the first embodiment, fourth wires 228 extend to overlap with all second end portions of first wires 225 structuring the first spare wires 224A to the third spare wires 224C and first end portions of third wires 227. Similarly, fifth wires 229 extend to overlap with all second end portions of second wires 226 structuring the first spare wires 224A to the third spare wires 224C and second end portions of the third wires 227.

Fourth Embodiment

Figure 18:
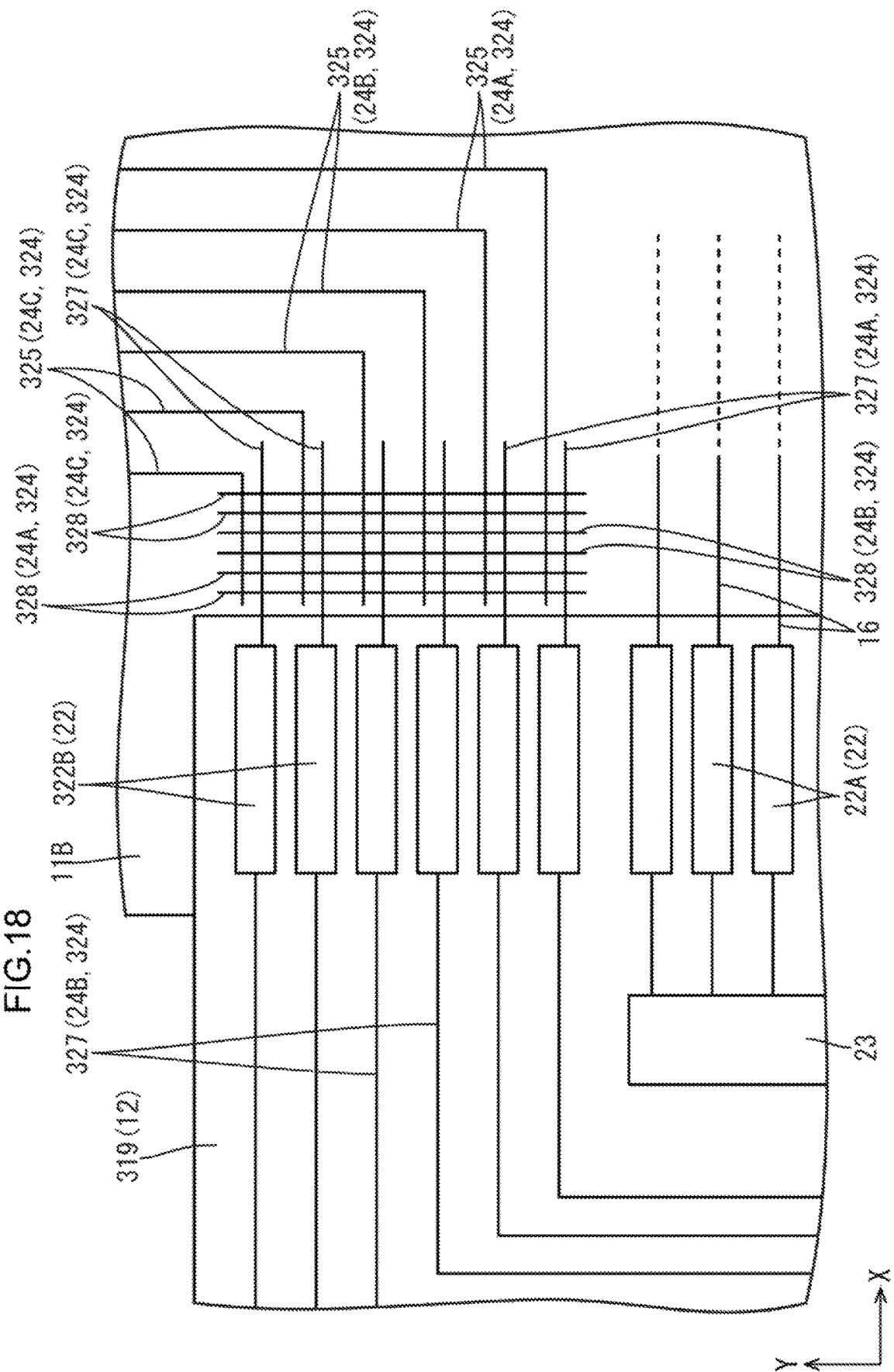
FIG. 18 is an enlarged plan view around a corner part in a liquid crystal panel according to a fourth embodiment of the technology described herein where fourth wires being spare wire are arranged.

With reference to FIG. 18, a description will be given of a fourth embodiment of the technology described herein. In the fourth embodiment, spare wires 324 whose structure is modified from the first embodiment are shown. Note that, a description of the structure, operation and effect similar to those described in the first embodiment will be omitted.

As shown in FIG. 18, in the spare wires 324 according to the present embodiment, second end portions of first wires 325, first end portions of third wires 327, and fourth wires 328 are arranged at the position adjacent to a spare wire-dedicated second terminal part 322B mounted on a gate-side flexible printed circuit board 319. This structure also exhibits the operation and effect similarly to the first embodiment.

Fifth Embodiment

Figure 19:
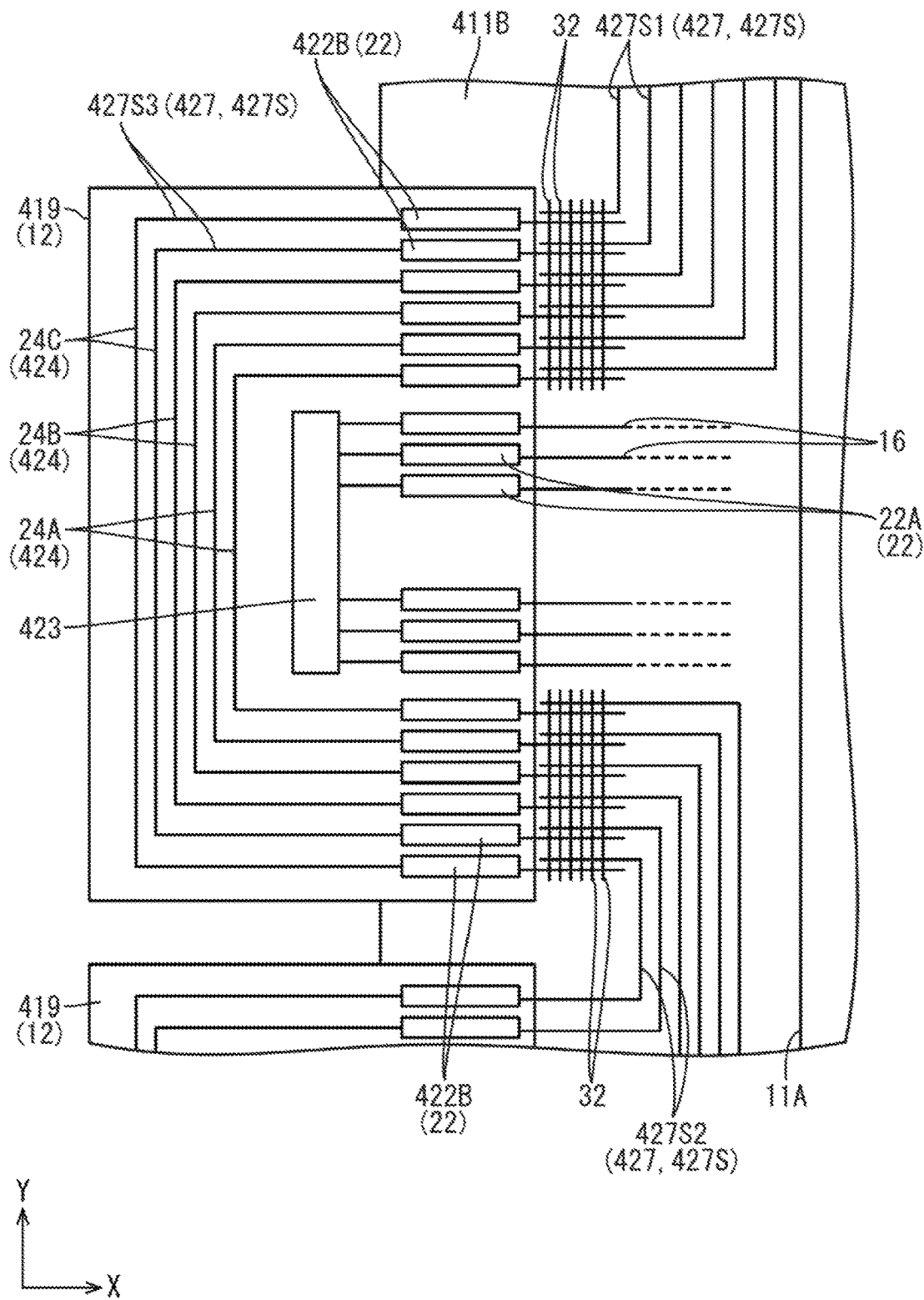
FIG. 19 is an enlarged plan view around a short side part in a liquid crystal panel according to a fifth embodiment of the technology described herein where eighth wires being spare wires are arranged.

With reference to FIG. 19, a description will be given of a fifth embodiment of the technology described herein. In the fifth embodiment, spare wires 424 whose structure is modified from the first embodiment are shown. Note that, a description of the structure, operation and effect similar to those described in the first embodiment will be omitted.

As shown in FIG. 19, in the spare wires 424 according to the present embodiment, third wires 427 are divided into (three) division third wires 427S. Specifically, the third wires 427 consist of: first division third wires 427S1 having a first end portion arranged adjacent to second end portions of the first wires (not shown); second division third wires 427S2 having second end portions arranged adjacent to second end portions of the second wires (not shown); and third division third wires 427S3 mostly arranged at a particular gate-side flexible printed circuit board 419. In the wires, the third division third wires 427S3 are arranged, at the gate-side flexible printed circuit board 419, to be folded back to surround a gate driver 423 on three sides. The opposite end portions of the third division third wires 427S3 are connected to spare wire-dedicated second terminal parts 422B on the array substrate 411B side. The opposite end portions of the third division third wires 427S3 are arranged at the position adjacent to the connection-target spare wire-dedicated second terminal parts 422B, where the opposite end portions of the third division third wires 427S3 are arranged and to the end portions of the first division third wires 427S1 and the end portions of the second division third wires 427S2 in the Y-axis direction. Then, with the first end portions of the third division third wire 427S3 and the end portions of the first division third wires 427S1 being adjacent to each other, and with second end portions of the third division third wires 427S3 and end portions of the second division third wires 427S2 being adjacent to each other, eighth wires 32 each made of a second metal film are overlapped via an insulating film (not shown). The eighth wires 32 are arranged as many as (six) the number of the third wires 427 in the X-axis direction at a certain interval. The third wires 427 having the divided structure are suitable in securing redundancy. Note that, while details are not shown, the eighth wires 32 overlapping with the end portions of the first division third wires 427S1 and the end portions of the third division third wire 427S3 may be connected to the end portions of the first division third wires 427S1 or the third division third wires 427S3 through contact holes, respectively. Similarly, the eighth wires 32 overlapping with the end portions of the third division third wires 427S3 and the end portions of the second division third wires 427S2 may be connected to the end portions of the third division third wires 427S3 or the second division third wires 427S2 via contact holes, respectively.

As has been described above, according to the present embodiment, the third wires 427 are divided into division third wires 427S including respective end portions arranged adjacent to each other. The present embodiment further includes an eighth wire 32 overlapping with the end portions of adjacent ones of the division third wires 427S via an insulating film. In this mode, by short-circuiting the end portions of adjacent ones of the division third wires 427S and the eighth wire 32 by a short-circuiting process such as laser irradiation, a signal is transmitted to the division third wires 427S via the eighth wire 32. Thus, the third wires 427 having the divided structure are suitable in securing redundancy.

Sixth Embodiment

Figure 20:
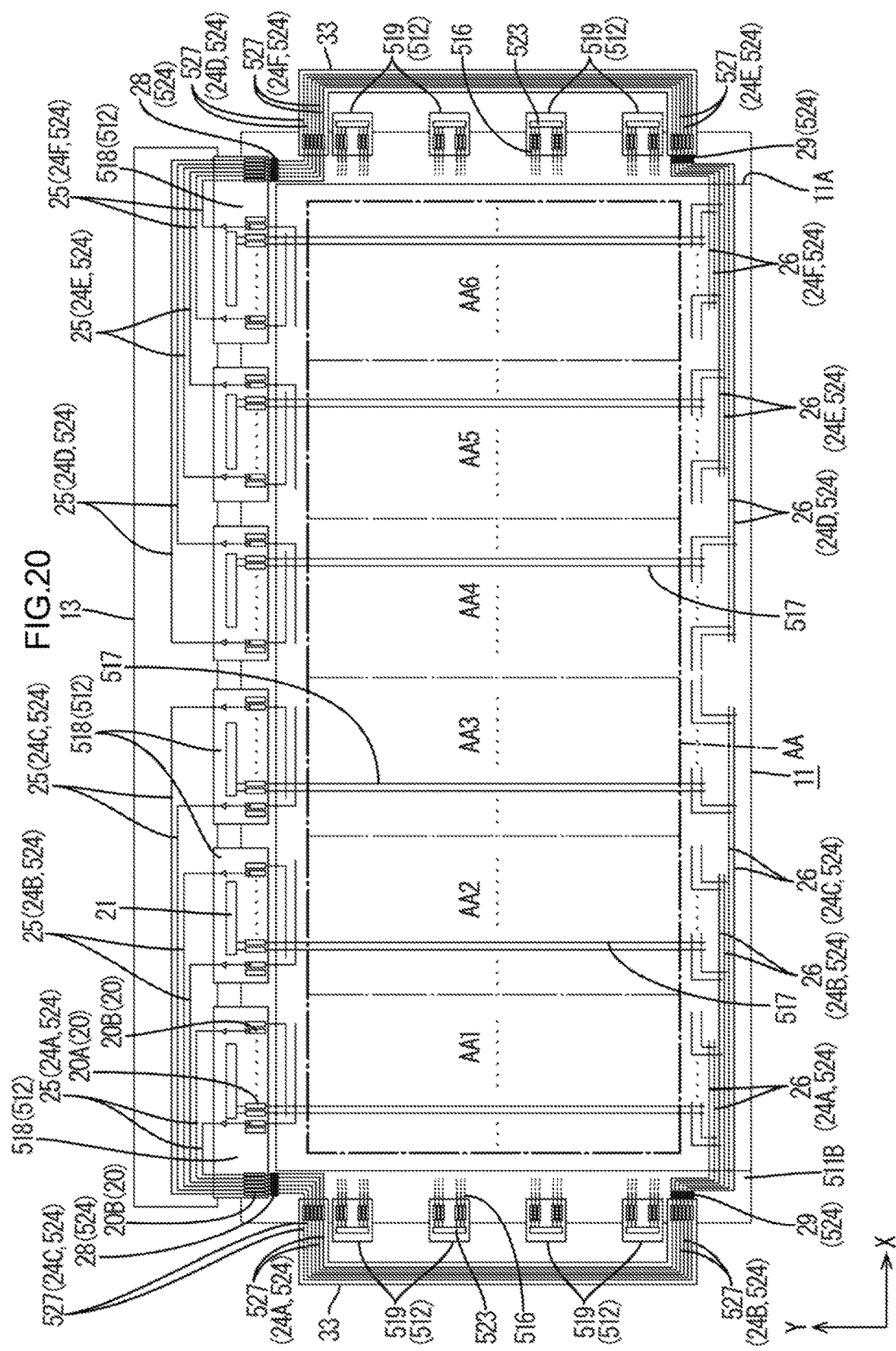
FIG. 20 is a plan view showing the wiring configuration of source lines and spare wires provided at a liquid crystal panel, flexible printed circuit boards, and a printed circuit board according to a sixth embodiment of the technology described herein.

With reference to FIG. 20, a description will be given of a sixth embodiment of the technology described herein. In the sixth embodiment, a flexible printed circuit board 512 whose structure is modified from the first embodiment is shown. Note that, a description of the structure, operation and effect similar to those described in the first embodiment will be omitted.

As shown in FIG. 20, the flexible printed circuit board 512 according to the present embodiment includes, in addition to source-side flexible printed circuit boards 518 and gate-side flexible printed circuit boards (display drive-dedicated flexible printed circuit boards) 519, a third wire-dedicated flexible printed circuit board 33 at which part of third wires 527 of spare wires 524 are mostly arranged. The third wire-dedicated flexible printed circuit board 33 is arranged to surround, on the outer side, four gate-side flexible printed circuit boards 519 arranged in the Y-axis direction. In accordance therewith, at the gate-side flexible printed circuit boards 519, while gate drivers 523 and any wires connected to the gate drivers 523 are provided, no third wires 527 are formed. That is, the third wires 527 are provided at an array substrate 511B and the third wire-dedicated flexible printed circuit board 33. In this mode, as compared to the first embodiment, the gate-side flexible printed circuit boards 519 are reduced in size by the amount of the part of the third wires 527 arranged in the third wire-dedicated flexible printed circuit board 33. Further, since no third wires 527 are arranged at the portion between adjacent ones of the gate-side flexible printed circuit boards 519 in the Y-axis direction at the array substrate 511B, the space for arranging the gate lines 516 is fully secured. In other words, the sufficient space for arranging the third wires 527 is secured at the third wire-dedicated flexible printed circuit board 33, which is suitable in reducing trace resistance and, hence, edge-rounding of a signal is less prone to occur. Note that, the third wire-dedicated flexible printed circuit board 33 should be connected to the array substrate 511B when any source line 517 suffers a wire breakage. That is, when no source lines 517 suffer a wire breakage, the necessity of connecting the third wire-dedicated flexible printed circuit board 33 is eliminated. Thus, the manufacturing cost reduces.

As has been described above, the present embodiment includes: an array substrate 511B provided with at least source lines 517 and a gate line 516 extending so as to cross the source lines 517; a gate-side flexible printed circuit board 519 provided with at least a gate driver 523 supplying a signal to the gate line 516, the gate-side flexible printed circuit board 519 being connected to the array substrate 511B; and a third wire-dedicated flexible printed circuit board 33 provided with at least part of third wires 527. In this mode, as compared to the case where, for example, the gate driver and part of third wires are provided at an identical flexible printed circuit board, the gate-side flexible printed circuit board 519 is reduced in size by the amount of the part of the third wires 527 being provided at the third wire-dedicated flexible printed circuit board 33. Further, when gate-side flexible printed circuit boards 519 are connected to be arranged at a certain interval to an end of the array substrate 511B, no third wires 527 are arranged at the portion between adjacent ones of the gate-side flexible printed circuit boards 519 at the array substrate 511B and, hence, the space for arranging the gate lines 516 is fully secured. In other words, the sufficient space for arranging the third wires 527 is secured at the third wire-dedicated flexible printed circuit board 33 and, hence, edge-rounding of a signal is less prone to occur.

Other Embodiment

The technology described herein is not limited to the embodiments described above and with reference to the drawings. For example, the following embodiments may be included in the technical scope of the technology described herein.

Figure 21:
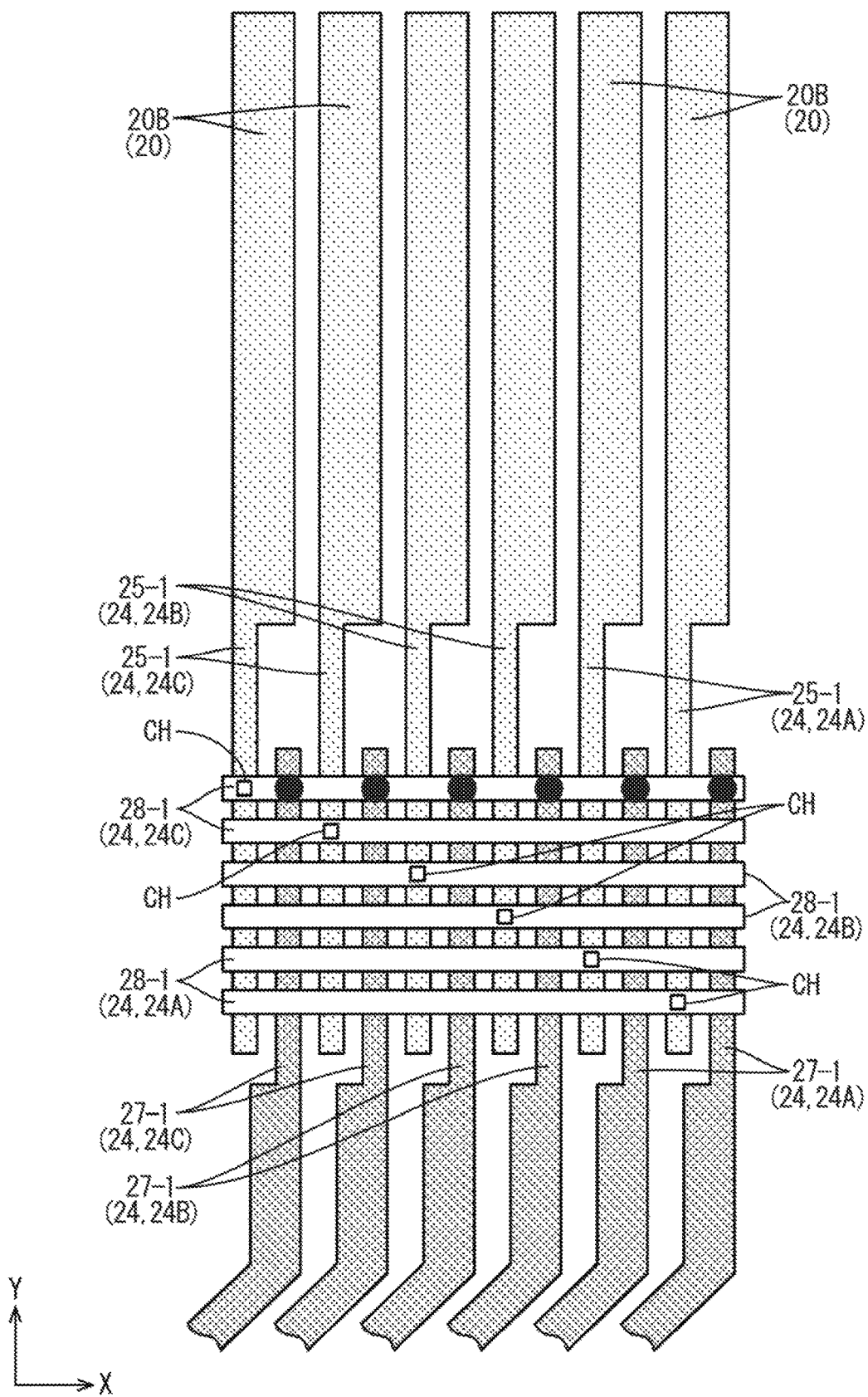
FIG. 21 is a plan view showing the relationship among first wires, third wires, and fourth wires being spare wires according to other embodiment (1) of the technology described herein.

(1) As a variation of the above-described first embodiment, as shown in FIG. 21, a contact hole CH may be arranged at each of the overlapping portion between fourth wires 28-1 and second end portions of first wires 25-1. In this case, a short-circuiting process should be performed on each of the overlapping portions between the fourth wires 28-1 and first end portions of third wires 27-1.

Figure 22:
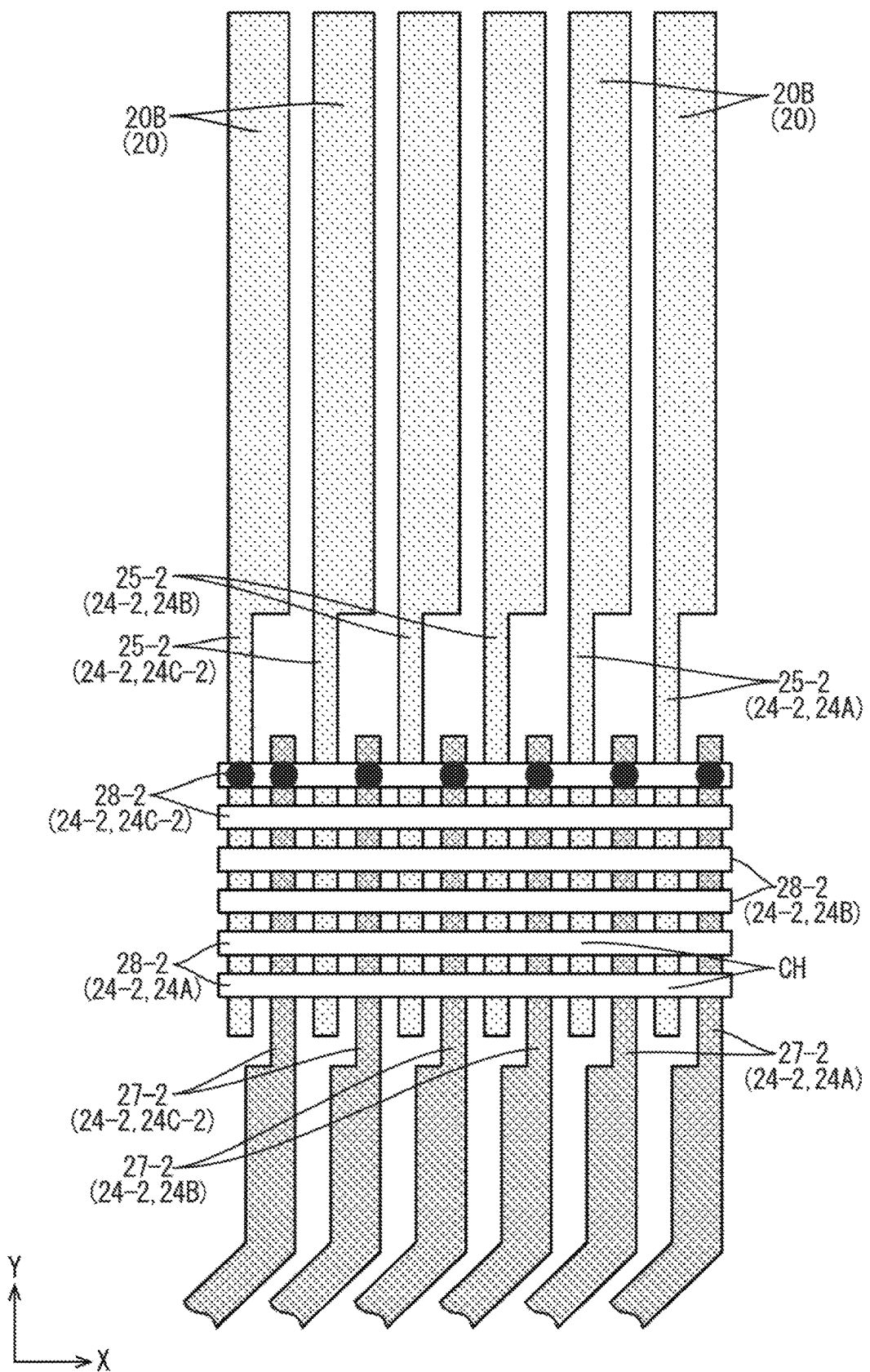
FIG. 22 is a plan view showing the relationship among first wires, third wires, and fourth wires being spare wires according to other embodiment (2) of the technology described herein.

(2) As a variation of the above-described first embodiment, as shown in FIG. 22, no contact hole may be formed between each of the overlapping portions between fourth wires 28-2 and second end portions of first wires 25-2 and first end portions of third wires 27-2. In this case, a short-circuiting process should be performed on an overlapping portion between the second end portion of a first wire 25-2 structuring repair-target spare wires 24-2 (third spare wires 24C-2 in FIG. 22) and any of fourth wires 28-2, and overlapping portions between that fourth wire 28-2 and first end portions of all the third wires 27-2.

(3) As a variation of the above-described first embodiment, a contact hole may be arranged at the overlapping portions between the fifth wire and second end portions of the third wires. Further, in the second to sixth embodiments also, the specific locations or the number of the contact holes may be changed as appropriate.

(4) In the above-described first embodiment, while examples are shown for describing the locations on which a short-circuiting process is performed, the locations on which a short-circuiting process is specifically performed can be changed as appropriate. The same holds true for the second to sixth embodiments.

(5) In the above-described second and third embodiments, while the case where the fourth wires and the fifth wires are provided two in number each is shown, the number of each of the fourth wire and the fifth wire may be one, or three or more.

(6) In any mode in addition to the above-described fourth embodiment, the arrangement of the fourth wire can be changed as appropriate. The arrangement of the fifth wire can also be changed as appropriate.

(7) In any mode in addition to the above-described fifth embodiment, the number of division of the third wires (the number of the types of the division third wires) may be changed to two, or four or more. When the number of division of the third wires is two, the eighth wires are arranged just at one location. When the number of division of the third wires is four or more, the eighth wires are arranged at three or more locations. That is, the number of locations where the eighth wires are arranged is obtained by subtracting one from the number of division of the third wires.

(8) In the above-described embodiments, while the description has been given of repair where one or two source lines each suffer a wire breakage, it is possible to allow an image signal to transmit through two or more third wires even when three to five source lines each suffer a wire breakage. This reduces the trace resistance.

(9) In the above-described embodiments, while the description has been given mainly of the first spare wires to the third spare wires, repair of any source line can be carried out using the fourth spare wires to the sixth spare wires in the similar manner.

(10) In the above-described embodiments, while the description has been given of the case where a short-circuiting process is performed in repairing a source line such that an image signal is transmitted through every third wire, the short-circuiting process may be performed such that the number of the third wires through which an image signal is transmitted is smaller than the total number of the third wires.

(11) In the above-described embodiments (excluding the second embodiment), while the description has been given of the case where kinds of wires structuring the spare wires are identical to one another in number, kinds of wires structuring the spare wires may be different from one another in number.

(12) In the above-described embodiments, while the description has been given of the case where the first wires are provided to, in addition to the array substrate, also the source-side flexible printed circuit boards and the printed circuit board, the first wires may be mostly arranged at the array substrate. Similarly, the third wires may not be formed at the gate-side flexible printed circuit boards and may be mostly formed at the array substrate.

(13) In the above-described embodiments, while the description has been given of the structure where the gate-side flexible printed circuit boards are mounted on the array substrate, the gate-side flexible printed circuit boards can be dispensed with. In this case, the third wires are mostly arranged at the array substrate. Note that, in this case, the array substrate is preferably provided with a monolithic circuit part having the function similar to that of the gate driver. Further, the gate driver may be COG (Chip On Glass) mounted on the array substrate.

(14) In the above-described embodiments, while the description has been given of the case where the source driver is mounted on each of the source-side flexible printed circuit boards, the source driver may be COG mounted on the array substrate.

(15) In addition to the embodiments described above, the number or the arrangement of the source-side flexible printed circuit boards and the gate-side flexible printed circuit boards can be changed as appropriate. For example, the gate-side flexible printed circuit boards may be mounted just on one of the short side parts of the liquid crystal panel. Further, the source-side flexible printed circuit boards may be mounted on each of the long side parts of the liquid crystal panel.

(16) In the above-described embodiments, while the description has been given of the case where two spare wires are provided for each section display region, one spare wire or three more spare wires may be provided for each section display region.

(17) In addition to the embodiments described above, the number of the section display regions (the number of sections) in the display region can be changed to five or smaller or seven or greater.

(18) In the above-described embodiments, while the description has been given of the spare wires for repairing any source line, in the case where spare wires for repairing any gate line is provided, the technology described herein is applicable to that spare wires.

(19) The display mode of the liquid crystal panel may be the TN mode, the VA mode, the RTN mode, the IPS mode, or the FFS mode. The technology described herein is applicable to any of these modes.

(20) In the above-described embodiments, while the description has been given of the case where the planar shape of the liquid crystal panel is a horizontally elongated rectangle, the planar shape of the liquid crystal display device may be a vertically elongated rectangle, a square, a circle, a semicircle, an ellipse, an oval, a trapezoid or the like.

(21) In the above-described embodiments, while the description has been exemplarily given of a liquid crystal display device including a liquid crystal panel, the display device may include other type of display panel (a PDP (plasma display panel), an organic EL panel, an EPD (microcapsule-based electrophoretic display panel), an MEMS (micro electro mechanical systems) display panel or the like).

The invention claimed is:

1. A display device comprising:
a plurality of display wires;
a plurality of first wires including first end portions overlapped with first end portions of the plurality of display wires via an insulating film;
a plurality of second wires including first end portions overlapped with second end portions of the plurality of display wires via the insulating film;
a plurality of third wires routed from second end portions of the plurality of first wires to second end portions of the plurality of second wires;
a plurality of fourth wires overlapping with the second end portions of the plurality of first wires and first end portions of the plurality of third wires via the insulating film; and
a plurality of fifth wires overlapping with the second end portions of the plurality of second wires and second end portions of the plurality of third wires via the insulating film, wherein
the second end portions of the plurality of first wires and the first end portions of the plurality of third wires have linear shapes elongated in a first direction,
the second end portions of the plurality of first wires and the first end portions of the plurality of third wires are arranged along a second direction that crosses the first direction,
the second end portions of the plurality of second wires and the second end portions of the plurality of third wires have linear shaped elongated in a third direction,
the second end portions of the plurality of second wires and the second end portions of the plurality of third wires are arranged along a fourth direction that crosses the third direction,
each of the plurality of fourth wires has a linear shape elongated in the second direction,
each of the plurality of fifth wires has a linear shape elongated in the fourth direction, and
the plurality of first wires, the plurality of second wires, the plurality of third wires, the plurality of fourth wires, and the plurality of fifth wires are identical to one another in number.

2. The display device according to claim 1, wherein
the insulating film interposed between the plurality of fourth wires and the second end portions of the plurality of first wires or the first end portions of the plurality of third wires includes contact holes for connecting the plurality of fourth wires to the second end portions of the plurality of first wires or the first end portions of the plurality of third wires, and
the insulating film interposed between the plurality of fifth wires and the second end portions of the plurality of second wires or the second end portions of the plurality of third wires includes contact holes for connecting the plurality of fifth wires to the second end portions of the plurality of second wires or the second end portions of the plurality of third wires.

3. The display device according to claim 1, further comprising:
a display substrate provided with at least the plurality of display wires and part of the plurality of first wires; and
at least one flexible printed circuit board provided with at least part of the plurality of first wires and connected to the display substrate.

4. The display device according to claim 3, wherein the first end portions of the plurality of third wires and the plurality of fourth wires are arranged adjacent to the at least one flexible printed circuit board in the display substrate.

5. The display device according to claim 1, further comprising:
a display substrate provided with at least the plurality of display wires and a second display wire extending so as to cross the display wires; and at least one second flexible printed circuit board provided with at least a second display driver supplying the second display wire with a signal and part of the plurality of third wires, the second flexible printed circuit board being connected to the display substrate.

6. The display device according to claim 5, wherein the at least one second flexible printed circuit board includes a plurality of second flexible printed circuit boards connected to the display substrate while being arranged at a certain interval along an end of the display substrate, the plurality of third wires are partially arranged at a portion between adjacent ones of the second flexible printed circuit boards in the display substrate, the second end portions of the plurality of third wires and the plurality of fifth wires are arranged adjacent to one of the plurality of second flexible printed circuit boards in the display substrate, and the one of the plurality of second flexible printed circuit boards nearest to the second end portions of the plurality of second wires.

* * * * *